United States Patent
Clapper et al.

(10) Patent No.: US 10,768,528 B2
(45) Date of Patent: Sep. 8, 2020

(54) PATTERNED FILM ARTICLE COMPRISING CLEAVABLE CROSSLINKER AND METHODS

(71) Applicant: 3M INNOVATIVE PROPERTIES COMPANY, St. Paul, MN (US)

(72) Inventors: Jason D. Clapper, Lino Lakes, MN (US); Dennis E. Vogel, Lake Elmo, MN (US); Ann R. Fornof, Austin, TX (US); Andrew R. Davis, Catonsville, MD (US); Babu N. Gaddam, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 246 days.

(21) Appl. No.: 15/745,737

(22) PCT Filed: Sep. 15, 2016

(86) PCT No.: PCT/US2016/051877
§ 371 (c)(1),
(2) Date: Jan. 18, 2018

(87) PCT Pub. No.: WO2017/058528
PCT Pub. Date: Apr. 6, 2017

(65) Prior Publication Data
US 2018/0231891 A1    Aug. 16, 2018

Related U.S. Application Data

(60) Provisional application No. 62/233,455, filed on Sep. 28, 2015.

(51) Int. Cl.
| | | |
|---|---|---|
| G03F 7/20 | (2006.01) |
| C08J 3/28 | (2006.01) |
| C08F 220/18 | (2006.01) |
| C09J 133/08 | (2006.01) |
| C09J 7/38 | (2018.01) |
| C08F 2/28 | (2006.01) |
| C08F 230/00 | (2006.01) |
| C08J 5/18 | (2006.01) |
| C09J 143/00 | (2006.01) |

(52) U.S. Cl.
CPC .............. *G03F 7/2004* (2013.01); *C08F 2/28* (2013.01); *C08F 220/18* (2013.01); *C08F 230/00* (2013.01); *C08J 3/28* (2013.01); *C08J 5/18* (2013.01); *C09J 7/385* (2018.01); *C09J 133/08* (2013.01); *C09J 143/00* (2013.01); C08F 220/1806 (2020.02); C08F 220/1808 (2020.02); C08J 2333/08 (2013.01); C08J 2343/00 (2013.01); C09J 2201/40 (2013.01); C09J 2205/114 (2013.01); C09J 2433/00 (2013.01)

(58) Field of Classification Search
CPC ....... C08J 3/28; C08J 5/28; C09J 7/385; C09J 2205/114; C09J 2205/31; G03F 7/2002; G03F 7/2004
USPC ....... 430/18, 396; 427/385.5, 508, 510, 516, 427/517
See application file for complete search history.

(56) References Cited

U.S. PATENT DOCUMENTS

| | | |
|---|---|---|
| 3,708,296 A | 1/1973 | Schlesinger |
| 4,069,055 A | 1/1978 | Crivello |
| 4,216,288 A | 8/1980 | Crivello |
| 4,250,311 A | 2/1981 | Crivello |
| 4,330,590 A | 5/1982 | Vesley |
| 4,889,234 A | 12/1989 | Sorensen |
| 5,084,586 A | 1/1992 | Farooq |
| 5,124,417 A | 6/1992 | Farooq |
| 5,506,279 A | 4/1996 | Babu |
| 5,554,664 A | 9/1996 | Lamanna |
| 5,872,158 A | 2/1999 | Kuczynski |
| 5,902,836 A | 5/1999 | Bennett |
| 5,976,690 A | 11/1999 | Williams |
| 6,495,229 B1 | 12/2002 | Carte |
| 6,627,384 B1 | 9/2003 | Kim |
| 6,652,970 B1 | 11/2003 | Everaerts |
| 6,821,348 B2 | 11/2004 | Baude |
| 6,899,775 B2 | 5/2005 | Hill |
| 7,108,920 B1 | 9/2006 | Crane |
| 7,514,202 B2 | 4/2009 | Ohsawa |
| 9,732,173 B2 * | 8/2017 | Clapper ............... C09J 5/06 |
| 10,351,649 B2 * | 7/2019 | Clapper ............... C08J 3/28 |
| 2003/0150384 A1 | 8/2003 | Baude |
| 2003/0151118 A1 | 8/2003 | Baude |
| 2004/0045931 A1 | 3/2004 | Hill |

(Continued)

FOREIGN PATENT DOCUMENTS

| | | |
|---|---|---|
| GB | 2345286 | 7/2000 |
| JP | 2002-296782 A | * 10/2002 |

(Continued)

OTHER PUBLICATIONS

Computer-generated translation of JP 2002-296782 (Oct. 2002). (Year: 2002).*

(Continued)

*Primary Examiner* — John A McPherson

(57) ABSTRACT

A pattern article comprising a copolymer having polymerized units derived from a cleavable crosslinking monomer, to which a pattern is imparted by the release of incipient acid from a thermal acid generator or photoacid generator. The selective release of the acid provides a pattern of high crosslink density and low crosslink density as result of the incipient acid cleaving a portion of the crosslinks.

5 Claims, 5 Drawing Sheets

(56) References Cited

U.S. PATENT DOCUMENTS

2006/0128165 A1    6/2006  Theiss
2006/0234014 A1   10/2006  Liu
2012/0288692 A1   11/2012  Broyles

FOREIGN PATENT DOCUMENTS

JP       2006-003844 A  *  1/2006
WO    WO 2015-164087     10/2015

OTHER PUBLICATIONS

Computer-generated translation of JP 2006-00344 (Jan. 2006). (Year: 2006).*
Inui, "Pressure-Sensitive Adhesion System Using Acrylate Block Copolymers in Response to Photoirradiation and Postbaking as the Dual External Stimuli for On-Demand Dismantling", ACS Applied Materials and Interfaces, Apr. 2012, vol. 4, No. 4, pp. 2124-2132.
Kirk-Othmer Encyclopedia of Chemical Technology, Fourth Edition, Supplement Volume, John Wiley and Sons, New York, 1998, pp. 253-255.
International Search Report for PCT International Application No. PCT/US2016/051877, dated Nov. 30, 2016, 5 pages.

* cited by examiner

PATTERNED FILM ARTICLE COMPRISING CLEAVABLE CROSSLINKER AND METHODS

CROSS REFERENCE TO RELATED APPLICATIONS

This application is a national stage filing under 35 U.S.C. 371 of PCT/US2016/051877, filed Sep. 15, 2016, which claims the benefit of U.S. Application No. 62/233,455, filed Sep. 28, 2015, the disclosure of which is incorporated by reference in its/their entirety herein.

FIELD OF THE INVENTION

This disclosure is directed to patterned film articles, and the methods of making the same.

BACKGROUND

The art describes many patterned articles in which an adhesive layer pattern coated, or two or more adhesives are arranged in a pattern.

US 2006/0234014 (Liu et al.) describes a tamper evident adhesive article comprising two distinct adhesives having different adhesive properties. The first adhesive is arranged in a pattern such as an indicia. Separation of the adhesive article from a substrate provides visual evidence of tampering.

U.S. Pat. No. 4,889,234 (Sorensen et al.) describes an adhesive label having a patterned adhesive of areas of full coverage of a permanent adhesive and areas of lesser coverage of the same adhesive. The patterned adhesive permits a resealable mode of operation.

U.S. Pat. No. 6,495,229 (Carte et al.) describes an adhesive article comprising a backing layer and a patterned coating of a pressure-sensitive adhesive thereon. The adhesive-free area is less than 25% of surface area of the backing.

U.S. Pat. No. 6,899,775 (Hill et al.) describes the printing of a substrate having a preprinted pattern having an ink design layer where there is differential adhesion within and without the print pattern. The print pattern is receptive to an ink and the design layer ink forms an image with a good bond to the print pattern, but the ink does not form an image on portions of the substrate outside the print pattern.

SUMMARY

The present disclosure provides a patterned film article, including patterned adhesive film articles, in which the pattern comprises elements of a high crosslink density adhesive copolymer and regions of low crosslink density adhesive copolymer.

In one aspect the disclosure provides a method of making the patterned article in which a layer of the crosslinked copolymer is selectively irradiated to cleave a portion of the crosslinks in the irradiated regions leading to regions of low crosslink density adhesive copolymer. As result of the regions of differential crosslink density, patterned films are provided in which the properties can be tailored to particular applications, and in which the properties, both mechanical and adhesive, may be anisotropic, as result of the patterning.

In one embodiment a composition comprising the crosslinked copolymer and a photoacid generator (PAG) is coated on a substrate and selectively irradiated or heated. Those irradiated regions photolyze the photoacid generator, releasing incipient acid, which catalyze the cleavage of a portion of the crosslinks.

In one embodiment a composition comprising the crosslinked copolymer and a thermal acid generator (TAG) is coated on a substrate and selectively/spatially heated. Heated regions thermolyze the TAG, releasing incipient acid, which catalyzed the cleavage of a portion of the crosslinks.

In another embodiment, a substrate may be coated with a photoacid generator in a preselected pattern. This article is then provided with a layer of crosslinked adhesive copolymer. When the composite article is irradiated, the patterned photoacid generator releases incipient acid, which catalyzes the cleavage of the crosslinks, providing regions of low-crosslink density adhesive copolymer.

The copolymer of this disclosure comprises polymerized units derived from a cleavable crosslinking monomer. The cleavable crosslinking monomer comprises at least two free-radically polymerizable groups and at least one group having the formula —O—C($R_2$)($R_3$)—O—, wherein $R_2$ and $R_3$ are independently hydrogen, alkyl, or aryl. The composition has a $T_g$ no greater than 50° C.

In some embodiments, the composition has a storage modulus greater than $3 \times 10^5$ Pa at 25° C. and 1 Hz and may be characterized as a non-tacky polymer. In other embodiments, the composition is a pressure sensitive adhesive.

Upon cleavage of at least a portion of the polymerized monomeric units derived from the cleavable crosslinking monomer, the composition exhibits a change in at least one physical property. For example, the composition may exhibit a decrease in polymer gel content, a decrease in storage modulus, or an increase in peel adhesion. By selective irradiation, one can tailor the adhesive properties of the copolymer.

In another embodiment, the composition comprises a polymer and fragments. The fragments comprise the reaction product of a free-radically polymerizable group bonded to a polymer chain and a pendent hydroxyl group. The composition has a $T_g$ no greater than 50° C.

Also described are articles, comprising the composition described herein (i.e. before and/or after cleavage); as well as methods of making the composition and methods of making articles.

In one embodiment, the copolymer is derived from syrup comprising i) a free-radically polymerizable solvent monomer; and ii) a solute (meth)acrylic polymer comprising polymerized units derived from one or more alkyl (meth)acrylate monomer(s) having a $T_g$ no greater than 10° C.; wherein the syrup comprises at least one cleavable crosslinking monomer or the (meth)acrylic solute polymer comprises polymerized units derived from at least one cleavable crosslinking monomer at least two free radically polymerizable groups and at least one group having the formula —O—C($R^2$)($R^3$)—O—, wherein $R_2$ and $R_3$ are independently hydrogen, alkyl, or aryl.

DETAILED DESCRIPTION

Figure 1:
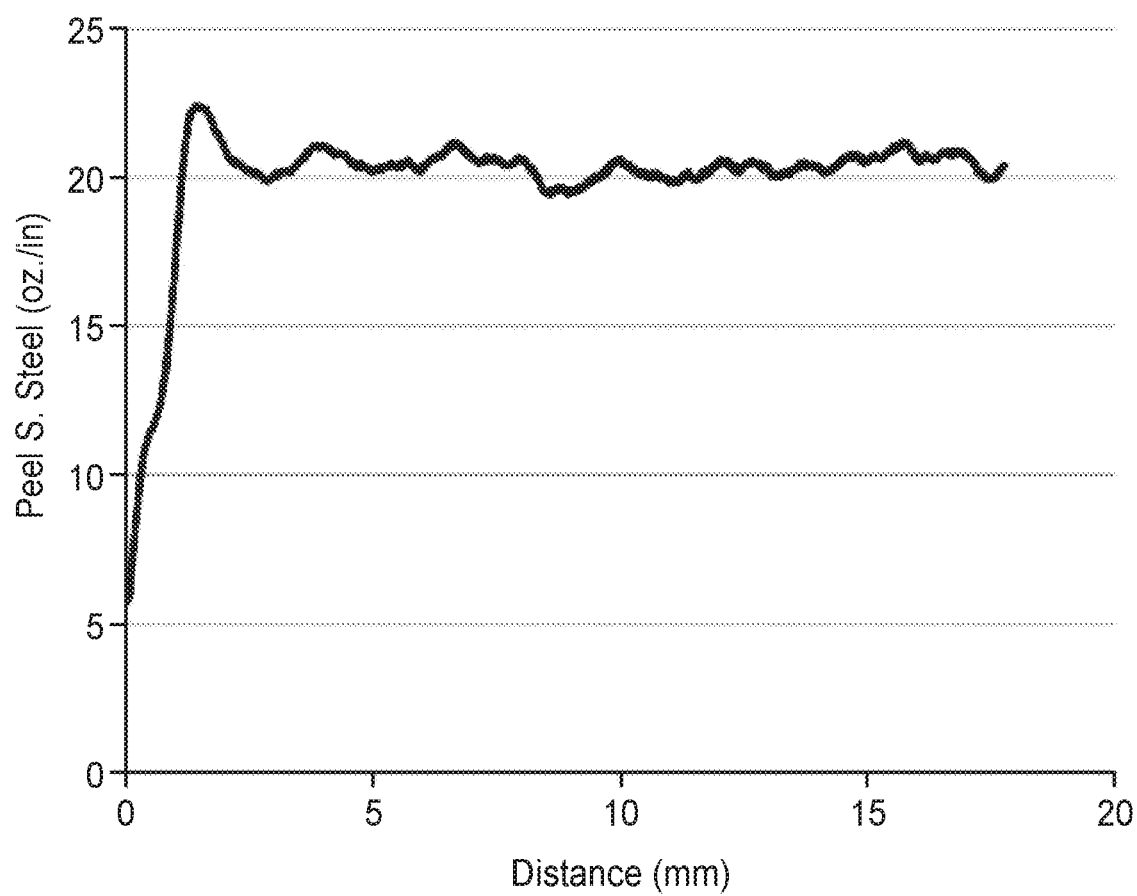
FIG. 1 is a plot of the Peel Adhesion data of Example 8a
FIG. 2 is a plot of the Peel Adhesion data of Example 8b

"Syrup composition" refers to a solution of a solute polymer in one or more solvent monomers, the composition having a typical viscosity from 100 to 8,000 cPs at 25° C. The syrup has a viscosity greater than the solvent monomer(s).

The term "alkyl" includes straight-chained, branched, and cyclic alkyl groups and includes both unsubstituted and substituted alkyl groups. Unless otherwise indicated, the alkyl groups typically contain from 1 to 20 carbon atoms. Examples of "alkyl" as used herein include, but are not limited to, methyl, ethyl, n-propyl, n-butyl, n-pentyl, isobutyl, t-butyl, isopropyl, n-octyl, 2-octyl, n-heptyl, ethylhexyl, cyclopentyl, cyclohexyl, cycloheptyl, adamantyl, isobornyl and norbornyl, and the like. Unless otherwise noted, alkyl groups may be mono- or polyvalent.

The term heteroalkyl refers to an alkyl group, as just defined, having at least one catenary carbon atom (i.e. in-chain) replaced by a catenary heteroatom such as O, S, or N.

The term "aryl" refers to a substituent derived from an aromatic ring and includes both unsubstituted and substituted aryl groups. Examples of "aryl" include phenyl, halogenated phenyl, and the like.

When a group is present more than once in a formula described herein, each group is "independently" selected unless specified otherwise.

Presently described are compositions comprising a copolymer. The polymer comprises polymerized units derived from a cleavable crosslinking monomer. Selective irradiation of the copolymer yields regions of reduced crosslink density in the irradiated regions, relative to the non-irradiated regions.

Cleavable crosslinkers, also referred to as degradable crosslinkers, are generally crosslinkers that are capable of copolymerizing with other free-radically polymerizable monomers to form a crosslinked polymeric network. Unlike conventional crosslinkers, cleavable crosslinkers are also capable of cleaving into separate fragments at the location of a covalent bond. Such cleavage, also described herein as activation, is generally achieved by exposing the crosslinked composition to an energy source such as heat and/or (e.g. ultraviolet) actinic radiation.

The composition described herein comprise polymerized units derived from a cleavable crosslinking monomer comprising at least two free-radically polymerizable groups and at least one group having the formula —O—C($R_2$)($R_3$)—O— wherein $R_2$ and $R_3$ are independently hydrogen, (e.g. $C_1$-$C_6$) alkyl, and aryl. The alkyl and aryl groups may optionally comprise substituents. The alkyl group may be linear or branched such as in the case of methyl, ethyl, propyl, butyl, or hexyl. In typical embodiments, at least one of or both of $R_2$ and $R_3$ are independently hydrogen or methyl.

The free-radically polymerizable groups of the crosslinking monomer are generally copolymerized with other monomers during the polymerization of the (meth)acrylic polymer, thereby incorporating polymerized units derived from the cleavable monomer into the backbone of the (meth)acrylic polymer. The free-radically polymerizable groups are ethylenically unsaturated terminal polymerizable groups including (meth)acryl such as (meth)acrylamide ($H_2C$=CHCON— and $H_2C$=CH($CH_3$)CON—) and (meth)acrylate($CH_2$CHCOO— and $CH_2C(CH_3)$COO—). When at least 50 wt-% of the free-radically polymerizable groups are (meth)acrylate groups, the polymer may be characterized as a (meth)acrylic polymer. Other ethylenically unsaturated polymerizable groups include vinyl ($H_2C$=C—) including vinyl ethers ($H_2C$=CHOCH—).

In some embodiments, the cleavable crosslinking monomer has a single —O—C($R_2$)($R_3$)—O—. In such embodiment, the cleavable crosslinking monomer typically has the formula:

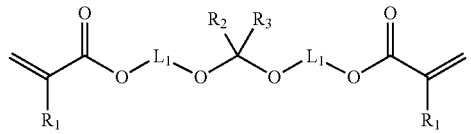

wherein
$R_1$ is hydrogen or methyl;
$R_2$ and $R_3$ are independently hydrogen, (e.g. $C_1$-$C_6$) alkyl, or aryl; and
$L_1$ is a divalent linking group.

The alkyl and aryl group may optionally comprise substituents. The divalent linking group, $L_1$, typically has a molecular weight no greater than 500, 250, 100, 75 or 50 g/mole. In some embodiments, the divalent linking group, $L_1$, is a (e.g. $C_1$-$C_6$) alkylene group. In some embodiments, $L_1$ is a $C_2$ or $C_3$ alkylene group.

In other embodiments, the cleavable crosslinking monomer has two —O—C($R_2$)($R_3$)—O— groups. In such embodiment, the cleavable crosslinking monomer typically has the formula:

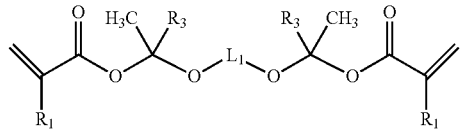

wherein $R_1$, $R_3$ and $L_1$ are the same as previously described.

The cleavable group may be characterized as an acetal or ketal group. Representative cleavable crosslinking monomers include for example 2,2-di(2-acryloxyethoxy)propane); (butane-1,4-diylbis(oxy))bis(ethane-1,1-diyl) diacrylate); bis (2-hydroxethyl methacrylate) acetal; bis (2-hydroxyethyl acrylate) acetal; acetone bis (2-hydroxypropyl methacrylate) ketal; and acetone bis (2-hydroxypropyl acrylate) ketal. Other cleavable crosslinking monomers can be synthesized.

The concentration of cleavable (e.g. acetal or ketal) crosslinking monomer is at least 0.05, 0.1, 0.2 wt. % and can generally range up to 50 wt. % of the composition. When the composition is free of non-polymerized components such as tackifier, plasticizer, and/or filler; the concentrations described herein are also equivalent to the concentration of such polymerized units in the (meth)acrylic polymer. In typical embodiments the concentration of cleavable (e.g. acetal or ketal) crosslinking monomer is at least 0.5 or 1 or 2 or 3 or 4 or 5 wt. % of the composition. As the concentration of such crosslinking monomer increases, the peel adhesion (180° to stainless steel) prior to cleavage can decrease. Thus, especially for embodiments wherein the composition is a PSA prior to cleavage the concentration of cleavable crosslinking monomer is typically no greater than 25 or 20 or 15 wt. % of the composition. The composition may comprise a single cleavable crosslinking monomer or a combination of two or more of such cleavable crosslinking monomers. When the composition comprises a combination of cleavable crosslinking monomers, the total concentration generally falls within the ranges just described.

The polymer and/or PSA composition is a copolymer of at least one cleavable crosslinking monomer and at least one other (non-cleavable) monomer. The $T_g$ of the copolymer may be estimated by use of the Fox equation, based on the $T_g$s of the constituent monomers and the weight percent thereof. The polymer and/or PSA composition has a $T_g$ no greater than 50° C.

In some embodiments, the polymer is a (meth)acrylic polymer and/or PSA comprising polymerized units derived from one or more (meth)acrylate ester monomers derived from a (e.g. non-tertiary) alcohol containing from 1 to 14 carbon atoms and preferably an average of from 4 to 12 carbon atoms. The (meth)acrylic polymer and/or PSA composition may also comprise one or more monomers (e.g. common to acrylic polymers and adhesives) such as a (meth)acrylic ester monomers (also referred to as (meth) acrylate acid ester monomers and alkyl(meth)acrylate monomers) optionally in combination with one or more other monomers such as acid-functional ethylenically unsaturated monomers, non-acid-functional polar monomers, and vinyl monomers.

Examples of monomers include the esters of either acrylic acid or methacrylic acid with non-tertiary alcohols such as ethanol, 1-propanol, 2-propanol, 1-butanol, 2-butanol, 1-pentanol, 2-pentanol, 3-pentanol, 2-methyl-1-butanol, 3-methyl-1-butanol, 1-hexanol, 2-hexanol, 2-methyl-1-pentanol, 3-methyl-1-pentanol, 2-ethyl-1-butanol, 3,5,5-trimethyl-1-hexanol, 3-heptanol, 1-octanol, 2-octanol, isoctylalcohol, 2-ethyl-1-hexanol, 1-decanol, 2-propyl-heptanol, 1-dodecanol, 1-tridecanol, 1-tetradecanol, and the like. In some embodiments, a preferred (meth)acrylate ester monomer is the ester of (meth)acrylic acid with isooctyl alcohol.

The polymer and/or PSA composition comprises one or more low $T_g$ monomers, having a $T_g$ no greater than 10° C. when the monomer is polymerized (i.e. independently) to form a homopolymer. In some embodiments, the low $T_g$ monomers have a Tg no greater than 0° C., no greater than –5° C., or no greater than –10° C. when reacted to form a homopolymer. The $T_g$ of these homopolymers is often greater than or equal to –80° C., greater than or equal to –70° C., greater than or equal to –60° C., or greater than or equal to –50° C. The $T_g$ of these homopolymers can be, for example, in the range of –80° C. to 20° C., –70° C. to 10° C., –60° C. to 0° C., or –60° C. to –10° C.

The low $T_g$ monomer may have the formula:

wherein $R_1$ is H or methyl and $R^8$ is an alkyl with 1 to 24 carbons or a heteroalkyl with 2 to 20 carbons and 1 to 6 heteroatoms selected from oxygen or sulfur. The alkyl or heteroalkyl group can be linear, branched, cyclic, or a combination thereof.

Exemplary low $T_g$ monomers include for example ethyl acrylate, n-propyl acrylate, n-butyl acrylate, isobutyl acrylate, t-butyl acrylate, n-pentyl acrylate, isoamyl acrylate, n-hexyl acrylate, 2-methylbutyl acrylate, 2-ethylhexyl acrylate, 4-methyl-2-pentyl acrylate, n-octyl acrylate, 2-octyl acrylate, isooctyl acrylate, isononyl acrylate, decyl acrylate, isodecyl acrylate, lauryl acrylate, isotridecyl acrylate, octadecyl acrylate, and dodecyl acrylate.

Low $T_g$ heteroalkyl acrylate monomers include, for example, 2-methoxyethyl acrylate and 2-ethoxyethyl acrylate.

In some embodiments, the polymer and/or PSA composition comprises at least one low $T_g$ monomer having a non-cyclic alkyl (meth)acrylate monomer(s) having 4 to 24 carbon atoms. In some embodiments, the (meth)acrylic polymer and/or PSA comprises at least one low $T_g$ monomer having a (e.g. branched) alkyl group with 6 to 24 carbon atoms. In some embodiments, the low $T_g$ monomer has a (e.g. branched) alkyl group with 7 or 8 carbon atoms. Exemplary monomers include, but are not limited to, 2-ethylhexyl (meth)acrylate, isooctyl (meth)acrylate, n-octyl (meth)acrylate, 2-octyl (meth)acrylate, isodecyl (meth)acrylate, and lauryl (meth)acrylate.

In some embodiments, the (e.g. low $T_g$) monomer is the ester of (meth)acrylic acid with an alcohol derived from a renewable source. A suitable technique for determining whether a material is derived from a renewable resource is through $^{14}C$ analysis according to ASTM D6866-10, as described in US2012/0288692. The application of ASTM D6866-10 to derive a "bio-based content" is built on the same concepts as radiocarbon dating, but without use of the age equations. The analysis is performed by deriving a ratio of the amount of organic radiocarbon ($^{14}C$) in an unknown sample to that of a modern reference standard. The ratio is reported as a percentage with the units "pMC" (percent modern carbon).

One suitable monomer derived from a renewable source is 2-octyl (meth)acrylate, as can be prepared by conventional techniques from 2-octanol and (meth)acryloyl derivatives such as esters, acids and acyl halides. The 2-octanol may be prepared by treatment of ricinoleic acid, derived from castor oil, (or ester or acyl halide thereof) with sodium hydroxide, followed by distillation from the co-product sebacic acid. Other (meth)acrylate ester monomers that can be renewable are those derived from ethanol, 2-methyl butanol and dihydrocitronellol.

In some embodiments, the (meth)acrylic polymer and/or PSA composition comprises a bio-based content of at least 25, 30, 35, 40, 45, or 50 wt. % using ASTM D6866-10, method B. In other embodiments, the (e.g. pressure sensitive) adhesive composition comprises a bio-based content of at least 55, 60, 65, 70, 75, or 80 wt. %. In yet other embodiments, the composition comprises a bio-based content of at least 85, 90, 95, 96, 97, 99 or 99 wt. %.

In some embodiments, the polymer and/or PSA composition comprises a high $T_g$ monomer, having a Tg greater than 10° C. and typically of at least 15° C., 20° C. or 25° C., and preferably at least 50° C. Suitable high $T_g$ alkyl (meth) acrylate monomers include, for example, t-butyl acrylate, methyl methacrylate, ethyl methacrylate, isopropyl methacrylate, n-butyl methacrylate, isobutyl methacrylate, s-butyl methacrylate, t-butyl methacrylate, stearyl methacrylate, phenyl methacrylate, cyclohexyl methacrylate, isobornyl acrylate, isobornyl methacrylate (110° C., according to Aldrich), norbornyl (meth)acrylate, benzyl methacrylate, 3,3,5 trimethylcyclohexyl acrylate, cyclohexyl acrylate, N-octyl acrylamide, and propyl methacrylate or combinations.

The alkyl (meth)acrylate monomers are typically present in the (meth)acrylic polymer in an amount of at least 50, 55, 60, 65, or 75 wt. % of the composition.

In some embodiments, the PSA composition comprises at least 50, 55, 60, 65, 70, 75, 80, 85, 90 or 95 wt. % or greater of low $T_g$ (e.g. alkyl) (meth)acrylate monomer(s). When high $T_g$ monomers are included in a pressure sensitive adhesive, the adhesive may include at least 5, 10, 15, 20, to 30 parts by weight of such high Tg (e.g. alkyl) (meth) acrylate monomer(s).

The (meth)acrylic polymer may alternatively comprise less low $T_g$ alkyl (meth)acrylate monomer(s). For example, the (meth)acrylic polymer may comprise at least 25, 30, 35, 40, or 45 wt. % of low $T_g$ alkyl (meth)acrylate monomer in combination with high Tg alkyl (meth)acrylate monomer(s) such that the total alkyl(meth)acrylate monomer is at least 50, 55, 60, 65, or 75 wt. %.

The (meth)acrylic polymer and/or PSA composition may optionally comprise an acid functional monomer (a subset of high Tg monomers), where the acid functional group may be an acid per se, such as a carboxylic acid, or a portion may be salt thereof, such as an alkali metal carboxylate. Useful acid functional monomers include, but are not limited to, those selected from ethylenically unsaturated carboxylic acids, ethylenically unsaturated sulfonic acids, ethylenically unsaturated phosphonic acids, and mixtures thereof. Examples of such compounds include those selected from acrylic acid, methacrylic acid, itaconic acid, fumaric acid, crotonic acid, citraconic acid, maleic acid, oleic acid, β-carboxyethyl (meth)acrylate, 2-sulfoethyl methacrylate, styrene sulfonic acid, 2-acrylamido-2-methylpropanesulfonic acid, vinylphosphonic acid, and mixtures thereof.

Due to their availability, acid functional monomers are generally selected from ethylenically unsaturated carboxylic acids, i.e. (meth)acrylic acids. When even stronger acids are desired, acidic monomers include the ethylenically unsaturated sulfonic acids and ethylenically unsaturated phosphonic acids. The acid functional monomer is generally used in amounts of 0.5 to 15 parts by weight, preferably 0.5 to 10 parts by weight, based on 100 parts by weight total monomer.

The (meth)acrylic polymer and/or PSA composition may optionally comprise other monomers such as a non-acid-functional polar monomer.

Representative examples of suitable polar monomers include but are not limited to 2-hydroxyethyl (meth)acrylate; N-vinylpyrrolidone; N-vinylcaprolactam; acrylamide; mono- or di-N-alkyl substituted acrylamide; t-butyl acrylamide; dimethylaminoethyl acrylamide; N-octyl acrylamide; poly(alkoxyalkyl) (meth)acrylates including 2-(2-ethoxyethoxy)ethyl (meth)acrylate, 2-ethoxyethyl (meth)acrylate, 2-methoxyethoxyethyl (meth)acrylate, 2-methoxyethyl methacrylate, polyethylene glycol mono (meth)acrylates; alkyl vinyl ethers, including vinyl methyl ether; and mixtures thereof. Preferred polar monomers include those selected from the group consisting of 2-hydroxyethyl (meth)acrylate and N-vinylpyrrolidinone. The non-acid-functional polar monomer may be present in amounts of 0 to 10, 15 or 20 parts by weight, or 0.5 to 10 parts by weight, based on 100 parts by weight total monomer.

When used, vinyl monomers useful in the (meth)acrylate polymer include vinyl esters (e.g., vinyl acetate and vinyl propionate), styrene, substituted styrene (e.g., α-methyl styrene), vinyl halide, and mixtures thereof. As used herein vinyl monomers are exclusive of acid functional monomers, acrylate ester monomers and polar monomers. Such vinyl monomers are generally used at 0 to 10 parts by weight, preferably 1 to 5 parts by weight, based on 100 parts by weight total monomer.

The composition, comprising polymerized units derived from the described cleavable crosslinking monomer, is generally stable until activation, meaning that the cleavable crosslinking monomer remains essentially crosslinked and unfragmented until activation. The shelf life of the composition at typical storage conditions, ranging from room temperature to 120° F. (25° C. to 49° C.) and 50% relative humidity, is generally sufficient to permit the intended use of the composition. The shelf life is typically at least about one month, about six months, or about one year.

Activation of the cleavable crosslinker occurs by application of an external energy source such as heat, (e.g. ultraviolet) actinic radiation, or a combination thereof as will subsequently be described.

Once activated, the (meth)acrylic polymer comprises fragments. The fragment comprises the reaction product of a free-radically polymerizable (e.g. (meth)acrylate)) group bonded to a (meth)acrylic polymer chain and a pendent hydroxyl group. The fragments that form during activation of the cleavable monomer lack free radicals and can also lack ethylenic unsaturation. Thus, the fragments lack functionality to react with each other. Further, the fragments lack functionality to react with any other polymerized units of the (meth)acrylic polymer or any other components present in the composition. Therefore, compositions containing the fragments of the cleavable crosslinker (i.e. cleaved crosslinker) are relatively stable. Further, the sum of the molecular weights of the total fragments is essentially the same as the molecular weight of the composition prior to fragmentation.

While not bound by theory, it is believed that the crosslink cleaves by an acid catalyzed elimination reaction resulting in a hydroxyl group at one end of the cleaved crosslink and an unsaturated group at the other end. It will be appreciated that cleavage will yield a complex mixture of products and in the presence of small amounts of water, hydrolysis products will predominate. Using the crosslinker of Preparatory Example 1 (CCD-1), the cleavage may be illustrated as follows.

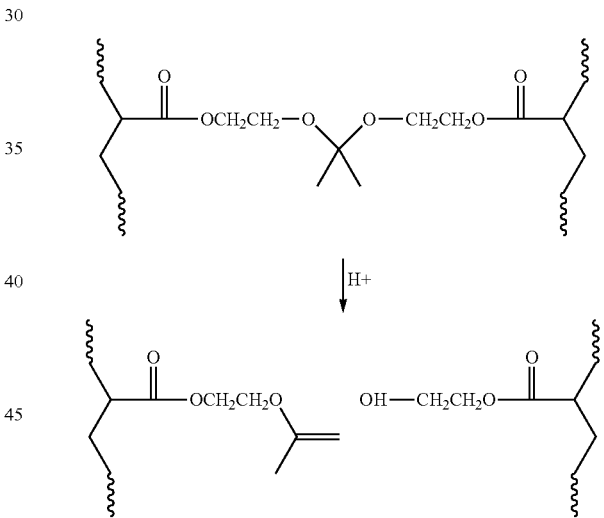

Due to the inclusion of a sufficient amount of low $T_g$ (as described) monomer and/or other additives such as plasticizer and tackifier compositions described herein have a glass transition temperature "$T_g$" of no greater than 50° C. prior to activation of the cleavable crosslinking monomer. As used herein, $T_g$ refers to the value obtained utilizing dynamic mechanical analysis according to the test method described in Applicant's copending application U.S. 61/983,532 filed 24 Apr. 2014. In some embodiments, the compositions have a $T_g$ no greater than 45° C., 40° C., 35° C., 30° C., 25° C., or 20° C. prior to activation of the cleavable crosslinking monomer. In some embodiments, the compositions have a $T_g$ no greater than 15° C., 10° C., 5° C., 0° C., or −0.5° C. prior to activation of the cleavable crosslinking monomer. In some embodiments, the compositions can exhibit a lower $T_g$ after activation of the cleavable crosslinking monomer. The decrease in $T_g$ may have an absolute value of at least 0.5 or 1.0. In some embodiments, the decrease in $T_g$ may have an absolute value of at least 2° C., 3° C., 4° C., 5° C., 6° C., 7° C., 8° C. or greater. In some embodiments, the decrease in $T_g$ is no greater than about 10° C.

In some embodiments, the composition is a pressure sensitive adhesive prior to and after activation of the cleavable crosslinking monomer. In this embodiment, the storage modulus (G') of the pressure sensitive adhesive at the application temperature, typically room temperature (e.g. 25° C.), is less than $3 \times 10^5$ Pa at a frequency of 1 Hz. As used herein, storage modulus (G') refers to the value obtained utilizing dynamic mechanical analysis according to the test method described in the examples. In some embodiments, the composition has a storage modulus of less than $2 \times 10^5$ Pa, $1 \times 10^5$ Pa, $9 \times 10^4$ Pa, $8 \times 10^4$ Pa, $7 \times 10^4$ Pa, $6 \times 10^4$ Pa, $5 \times 10^4$ Pa, $4 \times 10^4$ Pa, or $3 \times 10^4$ Pa, prior to activation of the cleavable crosslinking monomer. In some embodiments, the composition has a storage modulus (G') of less than $2.0 \times 10^4$ Pa or $2.5 \times 10^4$ Pa after activation of the cleavable crosslinking monomer.

In other embodiments, the composition is a non-tacky polymeric film and not a pressure sensitive adhesive prior to activation of the cleavable crosslinking monomer; yet the composition is a pressure sensitive adhesive after activation of the cleavable crosslinking monomer. In this embodiment, the storage modulus of the pressure sensitive adhesive at the application temperature (e.g. 25° C.) is greater than or equal to $3 \times 10^5$ Pa at a frequency of 1 hertz (Hz) prior to cleavage of the cleavable crosslinking monomer; yet less than $3 \times 10^5$ Pa at a frequency of 1 Hz at the application temperature, (e.g. 25° C.) after cleavage of the crosslinking monomer.

In yet other embodiments, the composition is a non-tacky film and not a pressure sensitive adhesive both prior to and after cleavage of the cleavable crosslinking monomer. In this embodiment, the storage modulus at the application temperature (e.g. 25° C.) is greater than or equal to $3 \times 10^5$ Pa at 1 Hz before and after activation.

Upon cleavage of at least a portion of the polymerized monomeric units derived from the cleavable crosslinking monomer, the composition exhibits a change in at least one physical property such as gel content, storage modulus, adhesive properties such as peel adhesion, as well as tensile properties such as peak force at break and strain at break.

In some embodiments, the gel content of the polymer, decreases upon cleavage of at least a portion of the polymerized monomeric units derived from the cleavable crosslinking monomer. In some embodiments, the gel content, as measured according to the test method described in the examples, is typically at least 90%, 95 or 100% prior to activation of the cleavable crosslinking monomer. The decrease in gel content, defined as the (gel content before activation–gel content after activation) is typically at least 5, 10 or 15%. For many embodiments, it is desirable that the composition has sufficient cohesive strength after activation. In this embodiment, it is desirable to select the concentration of cleavable crosslinker and the activation conditions such that the gel content of the polymer is at least 80% or 90% after activation. In other embodiments, such as temporary bonding applications the decrease in gel content of the polymer can be 50, 60, 70, or 80% or greater.

The reduction in crosslink density may be inferred by the change in the measured gel content of the irradiated and non-irradiated regions or pattern elements of the patterned coating. That is a decrease of crosslinking of 5% may be inferred by a decrease in the measured gel fraction. Crosslink density may be directly measured by means known in the art, including swelling methods using the Flory-Rehner equation or the Mooney-Rivlin equation. Gel fraction may be determined according to the test method described in Applicant's copending application U.S. 61/983,532 filed 24 Apr. 2014.

In some embodiments, the storage modulus at application temperature (e.g. 25° C.) and 1 Hz decreases upon cleavage of at least a portion of the polymerized monomeric units derived from the cleavable crosslinking monomer. In some embodiments, the storage modulus decreases by at least 1,000; 2,000; 3,000; 4,000; or 5,000 Pa. Relatively small decreases in modulus are useful, for example, to slightly adjust (e.g. increase) the adhesion properties of a PSA. In some embodiments, the storage modulus decreases by at least 10,000; 20,000; 30,000; 40,000; 50,000; or 60,000 Pa. In yet other embodiments, the storage modulus decreases by at least 75,000; 100,000; or 150,000 Pa. Greater decreases in modulus are useful, for example, for significantly adjusting (e.g. increasing) adhesion. In yet other embodiments, the storage modulus decreases by at least 100,000; 150,000; 200,000; 250,000; 300,000; 350,000; 400,000; 450,000; 500,000; 550,000 or 600,000 Pa. Even greater decreases in modulus are useful, for example, when an initially non-tacky film is rendered a PSA upon cleavage of the crosslinking monomer. The change in storage modulus, defined as the (storage modulus before activation–storage modulus after activation)/storage modulus before activation×100%, can be at least 5, 10, 15, or 20% and may range up to 50, 60, 70% or greater.

In some embodiments, the peel adhesion (e.g. to stainless steel or glass), as measured according to the test method described in the examples, increases upon cleavage of at least a portion of the polymerized monomeric units derived from the cleavable crosslinking monomer. In some embodiments, the increase in peel adhesion, defined as the (peel adhesion before activation–peel adhesion after activation) can be at least 1, 2, 3, 4, or 5 N/dm ranging up to for example 15, 16, 17, 18, 19, or 20 N/dm.

In some embodiments, the PSA composition exhibits high shear values (to stainless steel), i.e. greater than 10,000 minutes at 70° C. after activation of the cleavable crosslinker. Notably the PSA exhibits comparable wet out properties as conventional crosslinkers prior to activation, e.g. a wet out, as measured according to the test method described in the examples, of less than 5, 4, 3, or 2 sec/in².

In yet other embodiments, the tensile properties as measured according to the test method described in the examples, change upon cleavage of at least a portion of the polymerized monomeric units derived from the cleavable crosslinking monomer. For example, the peak force at break can decrease. In some embodiments, the decrease in peak force, defined as the (peak force before activation–peak force after activation) can be at least 100, 200, 300, 400, 500, 600 g or greater. In some embodiments, the strain at break defined as the (strain at break before activation–stain at break after activation) can be at least 50, 75 or 100% or greater. In some embodiments, the strain at break after activation is at least 150%, 200%, or 250%, or greater; which is indicative of improved flexibility.

The (meth)acrylic polymer and/or PSA may optionally comprise at least one other crosslinker, that is not a cleavable crosslinker, in addition to the cleavable crosslinker. Thus, the crosslinks (or crosslinked network) formed by the non-cleavable crosslinker are not fragmented upon activation of the cleavable crosslinker.

In some embodiments, the (e.g. pressure sensitive) adhesive comprises a non-cleavable multifunctional (meth)acrylate crosslinking monomer. Examples of useful multifunctional (meth)acrylates include, but are not limited to, di(meth)acrylates, tri(meth)acrylates, and tetra(meth)acrylates, such as 1,6-hexanediol di(meth)acrylate, poly(ethylene glycol) di(meth)acrylates, polybutadiene di(meth)acrylate, polyurethane di(meth)acrylates, and propoxylated glycerin tri(meth)acrylate, and mixtures thereof.

Generally the multifunctional (meth)acrylate is not part of the original monomer mixture, but added subsequently to the syrup after the formation of the (meth)acrylic polymer. When utilized, the multifunctional (meth)acrylate is typically used in an amount of at least 0.05, 0.10, 0.15, 0.20 up to 1, 2, 3, 4, or 5 parts by weight, relative to 100 parts by weight of the total monomer content.

In other embodiments, (meth)acrylic polymer and/or PSA may further comprise a non-cleavable chlorinated triazine crosslinking compound. The triazine crosslinking agent may have the formula.

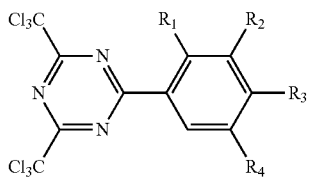

wherein $R_1$, $R_2$, $R_3$ and $R_4$ of this triazine crosslinking agent are independently hydrogen or alkoxy group, and 1 to 3 of $R_1$, $R_2$, $R_3$ and $R_4$ are hydrogen. The alkoxy groups typically have no greater than 12 carbon atoms. In favored embodiments, the alkoxy groups are independently methoxy or ethoxy. One representative species is 2,4,-bis(trichloromethyl)-6-(3,4-bis(methoxy)phenyl)-triazine. Such triazine crosslinking compound are further described in U.S. Pat. No. 4,330,590.

In some embodiments, the (meth)acrylic polymer and/or PSA comprises predominantly (greater than 50%, 60%, 70%, 80%, or 90% of the total crosslinks) or exclusively crosslinks from the cleavable crosslinking monomer. In such embodiment, the composition may be free of other non-cleavable crosslinking monomers, particularly multi(meth)acrylate crosslinkers such as 1, 6-hexane diol diacrylate (HDDA).

The activation of the cleavable crosslinker is achieved by the addition of a photoacid generator and exposing the composition to (e.g. ultraviolet) actinic radiation. When the polymer is cured by exposure to actinic radiation, the exposure conditions that cause cleavage are generally at a different and lower wavelength bandwidth than those utilized for polymerization of the (meth)acrylic polymer. The difference is typically at least about 25 nm.

In favored embodiments, activation of the cleavable crosslinker is catalyzed by an acid, photoacid generator ("PAG"), or thermal acid generator ("TAG"). Thus, inclusion of such can reduce the exposure time to actinic radiation, or reduce the time and temperature of heat activated cleavage of the crosslinking monomer. The photoacid generator is typically used in amounts of at least 0.005 or 0.01 wt. % and typically no greater than 10 wt-% of the composition. In some embodiments, the concentration is no greater than 5, 4, 3, 2, 1, or 0.5 wt. % of the composition.

Upon irradiation with light energy, ionic photoacid generators undergo a fragmentation reaction and release one or more molecules of Lewis or Brönsted acid that catalyze the cleavage of the cleavable crosslinking monomer. Useful photoacid generators are thermally stable and do not undergo thermally induced reactions with the copolymer, and are readily dissolved or dispersed in the composition. Preferred photoacid generators are those in which the incipient acid has a pKa value of ≤0. Photoacid generators are known and reference may be made to K. Dietliker, Chemistry and Technology of UV and EB Formulation for Coatings, Inks and Paints, vol. III, SITA Technology Ltd., London, 1991. Further reference may be made to Kirk-Othmer Encyclopedia of Chemical Technology, $4^{th}$ Edition, Supplement Volume, John Wiley and Sons, New York, year, pp 253-255.

Cations useful as the cationic portion of the ionic photoinitiators of the invention include organic onium cations, for example those described in U.S. Pat. Nos. 4,250,311, 3,708,296, 4,069,055, 4,216,288, 5,084,586, 5,124,417, 5,554,664 and such descriptions incorporated herein by reference, including aliphatic or aromatic Group IVA VIIA (CAS version) centered onium salts, preferably I-, S-, P-, Se- N- and C-centered onium salts, such as those selected from, sulfoxonium, iodonium, sulfonium, selenonium, pyridinium, carbonium and phosphonium, and most preferably I-, and S-centered onium salts, such as those selected from sulfoxonium, diaryliodonium, triarylsulfonium, diarylalkylsulfonium, dialkylarylsulfonium, and trialkylsulfonium wherein "aryl" and "alkyl" are as defined and having up to four independently selected substituents. The substituents on the aryl or alkyl moieties will preferably have less than 30 carbon atoms and up to 10 heteroatoms selected from N, S, non-peroxidic O, P, As, Si, Sn, B, Ge, Te, Se. Examples include hydrocarbyl groups such as methyl, ethyl, butyl, dodecyl, tetracosanyl, benzyl, allyl, benzylidene, ethenyl and ethynyl; hydrocarbyloxy groups such as methoxy, butoxy and phenoxy; hydrocarbylmercapto groups such as methylmercapto and phenylmercapto; hydrocarbyloxycarbonyl groups such as methoxycarbonyl and phenoxycarbonyl; hydrocarbylcarbonyl groups such as formyl, acetyl and benzoyl; hydrocarbylcarbonyloxy groups such as acetoxy and cyclohexanecarbonyloxy; hydrocarbylcarbonamido groups such as acetamido and benzamido; azo; boryl; halo groups such as chloro, bromo, iodo and fluoro; hydroxy; oxo; diphenylarsino; diphenylstilbino; trimethylgermano; trimethylsiloxy; and aromatic groups such as cyclopentadienyl, phenyl, tolyl, naphthyl, and indenyl. With the sulfonium salts, it is possible for the substituent to be further substituted with a dialkyl- or diarylsulfonium cation; an example of this would be 1,4-phenylene bis(diphenylsufonium).

Useful onium salt photoacid generators include diazonium salts, such as aryl diazonium salts; halonium salts, such as diarlyiodonium salts; sulfonium salts, such as triarylsulfonium salts, such as triphenyl sulfonium triflate; selenonium salts, such as triarylselenonium salts; sulfoxonium salts, such as triarylsulfoxonium salts; and other miscellaneous classes of onium salts such as triaryl phosphonium and arsonium salts, and pyrylium and thiopyrylium salts.

Ionic photoacid generators include, for example, bis(4-t-butylphenyl) iodonium hexafluoroantimonate (FP5034™ from Hampford Research Inc., Stratford, Conn.), a mixture of triarylsulfonium salts (diphenyl(4-phenylthio) phenylsufonium hexafluoroantimonate, bis(4-(diphenylsulfonio)phenyl)sulfide hexafluoroantimonate) available as Syna PI-6976™ from Synasia Metuchen, N.J., (4-methoxyphenyl)phenyl iodonium triflate, bis(4-tert-butylphenyl) iodonium camphorsulfonate, bis(4-tert-butylphenyl) iodonium hexafluoroantimonate, bis(4-tert-butylphenyl) iodonium hexafluorophosphate, bis(4-tert-butylphenyl) iodonium tetraphenylborate, bis(4-tert-butylphenyl) iodonium tosylate, bis(4-tert-butylphenyl) iodonium triflate, ([4-(octyloxy)phenyl]phenyliodonium hexafluorophosphate), ([4-(octyloxy)phenyl]phenyliodonium hexafluoroantimonate), (4-isopropylphenyl)(4-methylphenyl)iodonium tetrakis (pentafluorophenyl) borate (available s Rhodorsil2074™ from Bluestar Silicones, East Brunswick, N.J.), bis(4-methylphenyl) iodonium hexafluorophosphate (available as Omnicat440™ from IGM Resins Bartlett, Ill.), 4-(2-hydroxy-1-tetradecycloxy)phenyl]phenyl iodonium hexafluoroantimonate, triphenyl sulfonium hexafluoroantimonate (available as CT-548™ from Chitec Technology Corp. Taipei, Taiwan), diphenyl(4-phenylthio)phenylsufonium hexafluorophosphate, bis(4-(diphenylsulfonio)phenyl)sulfide bis(hexafluorophosphate), diphenyl(4-phenylthio)phenylsufonium hexafluoroantimonate, bis(4-(diphenyl sulfonio)phenyl)sulfide hexafluoroantimonate, and blends of these triarylsulfonium salts available from Synasia, Metuchen, N.J. under the trade designations of Syna PI-6992™ and Syna PI-6976™ for the $PF_6$ and $SbF_6$ salts, respectively.

When a thermal acid generator (TAG) is included in the composition, the time and temperature of heat activated cleavage of the cleavable crosslinking monomer can be reduced. Further, the production of the thermally-generated acid can be controlled by the chemical structure of the TAG. In some embodiments, the amount of TAG included in the adhesive formulation is in a range from about 0.01 wt. % to about 0.1 wt. %.

Upon exposure to thermal energy, TAGs undergo a fragmentation reaction and release one or more molecules of Lewis or Bronsted acid. Useful TAGs are thermally stable up to the activation temperature. Preferred TAGs are those in which the incipient acid has a pKa value of less than or equal to 0. Useful thermal acid generators have an activation temperature of 150° C. or less, preferably 140° C. or less. As used herein, "activation temperature" is that temperature at which the thermal release of the incipient acid by the TAG in the adhesive formulation occurs. Typically the TAG will have an activation temperature in a range from about 50° C. to about 150° C.

Useful classes of TAGs can include, for example, alkylammonium salts of sulfonic acids, such as triethylammonium p-toluenesulfonate (TEAPTS). Another suitable class of TAGs is that disclosed in U.S. Pat. No. 6,627,384 (Kim, et al.), the disclosure of which is incorporated herein by reference, which describes cyclic alcohols with adjacent sulfonate leaving groups. Suitable classes of thermal acid generators also include those described in U.S. Pat. No. 7,514,202 (Ohsawa et al.) and U.S. Pat. No. 5,976,690 (Williams et al.), the disclosures of which are incorporated herein by reference.

Optionally, it is within the scope of this invention to include photosensitizers or photoaccelerators with the photoacid generators. Use of photosensitizers or photoaccelerators alters the wavelength sensitivity of radiation-sensitive compositions employing the latent catalysts and photoacid generators of this invention. This is particularly advantageous when the photoacid generator does not strongly absorb the incident radiation. Use of photosensitizers or photoaccelerators increases the radiation sensitivity, allowing shorter exposure times and/or use of less powerful sources of radiation.

The (meth)acrylic copolymers can be polymerized by various techniques including, but not limited to, solvent polymerization, dispersion polymerization, solventless bulk polymerization, and radiation polymerization, including processes using ultraviolet light, electron beam, and gamma radiation. The monomer mixture may comprise a polymerization initiator, especially a thermal initiator or a photoinitiator of a type and in an amount effective to polymerize the comonomers.

A typical solution polymerization method is carried out by adding the monomers, a suitable solvent, and an optional chain transfer agent to a reaction vessel, adding a free radical initiator, purging with nitrogen, and maintaining the reaction vessel at an elevated temperature (e.g. about 40 to 100° C.) until the reaction is complete, typically in about 1 to 20 hours, depending upon the batch size and temperature. Examples of typical solvents include methanol, tetrahydrofuran, ethanol, isopropanol, acetone, methyl ethyl ketone, methyl acetate, ethyl acetate, toluene, xylene, and an ethylene glycol alkyl ether. Those solvents can be used alone or as mixtures thereof.

Useful initiators include those that, on exposure to heat or light, generate free-radicals that initiate (co)polymerization of the monomer mixture. The initiators are typically employed at concentrations ranging from about 0.0001 to about 3.0 parts by weight, preferably from about 0.001 to about 1.0 parts by weight, and more preferably from about 0.005 to about 0.5 parts by weight of the total monomer or polymerized units.

Suitable initiators include but are not limited to those selected from the group consisting of azo compounds such as VAZO 64 (2,2'-azobis(isobutyronitrile)), VAZO 52 (2,2'-azobis(2,4-dimethylpentanenitrile)), and VAZO 67 (2,2'-azobis-(2-methylbutyronitrile)) available from E.I. du Pont de Nemours Co., peroxides such as benzoyl peroxide and lauroyl peroxide, and mixtures thereof. The preferred oil-soluble thermal initiator is (2,2'-azobis-(2-methylbutyronitrile)). When used, initiators may comprise from about 0.05 to about 1 part by weight, preferably about 0.1 to about 0.5 part by weight based on 100 parts by weight of monomer components in the pressure sensitive adhesive.

The polymers have pendent unsaturated groups that can be crosslinked by a variety of methods. These include addition of thermal or photoinitiators followed by heat or actinic radiation exposure after coating. The polymers may also be crosslinked by exposure to electron beam or gamma irradiation.

Thus the (meth)acrylic polymer can be crosslinked by exposure to heat and/or or actinic (e.g. UV) radiation. The (meth)acrylic polymer can also be cleaved into fragments, by exposure to heat and/or actinic (e.g. UV). However, the exposure conditions for cleavage are generally different (higher temperature and/or lower wavelength bandwidth) than the exposure conditions for polymerization.

One method of preparing (meth)acrylic polymers includes partially polymerizing monomers to produce a syrup composition comprising the solute (meth)acrylic polymer and unpolymerized solvent monomer(s). The unpolymerized solvent monomer(s) typically comprises the same monomer as utilized to produce the solute (meth)acrylic polymer. If some of the monomers were consumed during the polymerization of the (meth)acrylic polymer, the unpolymerized solvent monomer(s) comprises at least some of the same monomer(s) as utilized to produce the solute (meth)acrylic polymer. Further, the same monomer(s) or other monomer(s) can be added to the syrup once the (meth)acrylic polymer has been formed. Partial polymerization provides a coatable solution of the (meth)acrylic solute polymer in one or more free-radically polymerizable solvent monomers. The partially polymerized composition is then coated on a suitable substrate and further polymerized.

In some embodiments, the cleavable crosslinking monomer is added to the monomer(s) utilized to form the (meth)acrylic polymer. Alternatively or in addition thereto, the cleavable crosslinking monomer may be added to the syrup after the (meth)acrylic polymer has been formed. The (meth)acrylate group of the crosslinker and other (e.g. (meth)acrylate) monomers utilized to form the (meth)acrylic polymer preferentially polymerize forming an acrylic backbone with the cleavable group.

The syrup method provides advantages over solvent or solution polymerization methods; the syrup method yielding higher molecular weight materials. These higher molecular weights increase the amount of chain entanglements, thus increasing cohesive strength. Also, the distance between cross-links can be greater with high molecular syrup polymer, which allows for increased wet-out onto a surface.

Polymerization of the (meth)acrylate solvent monomers can be accomplished by exposing the syrup composition to energy in the presence of a photoinitiator. Energy activated initiators may be unnecessary where, for example, ionizing radiation is used to initiate polymerization. Typically, a photoinitiator can be employed in a concentration of at least 0.0001 part by weight, preferably at least 0.001 part by weight, and more preferably at least 0.005 part by weight, relative to 100 parts by weight of the syrup.

A preferred method of preparation of the syrup composition is photoinitiated free radical polymerization. Advantages of the photopolymerization method are that 1) heating the monomer solution is unnecessary and 2) photoinitiation is stopped completely when the activating light source is turned off. Polymerization to achieve a coatable viscosity may be conducted such that the conversion of monomers to polymer is up to about 30%. Polymerization can be terminated when the desired conversion and viscosity have been achieved by removing the light source and by bubbling air (oxygen) into the solution to quench propagating free radicals. The solute polymer(s) may be prepared conventionally in a non-monomeric solvent and advanced to high conversion (degree of polymerization). When solvent (monomeric or non-monomeric) is used, the solvent may be removed (for example by vacuum distillation) either before or after formation of the syrup composition. While an acceptable method, this procedure involving a highly converted functional polymer is not preferred because an additional solvent removal step is required, another material may be required (a non-monomeric solvent), and dissolution of the high molecular weight, highly converted solute polymer in the monomer mixture may require a significant period of time.

The polymerization is preferably conducted in the absence of solvents such as ethyl acetate, toluene and tetrahydrofuran, which are non-reactive with the functional groups of the components of the syrup composition. Solvents influence the rate of incorporation of different monomers in the polymer chain and generally lead to lower molecular weights as the polymers gel or precipitate from solution. Thus, the (e.g. pressure sensitive) adhesive can be free of unpolymerizable organic solvent.

Useful photoinitiators include benzoin ethers such as benzoin methyl ether and benzoin isopropyl ether; substituted acetophenones such as 2,2-dimethoxy-2-phenylacetophenone photoinitiator, available the trade name IRGACURE 651 or ESACURE KB-1 photoinitiator (Sartomer Co., West Chester, Pa.), and dimethylhydroxyacetophenone; substituted α-ketols such as 2-methyl-2-hydroxy propiophenone; aromatic sulfonyl chlorides such as 2-naphthalenesulfonyl chloride; and photoactive oximes such as 1-phenyl-1,2-propanedione-2-(O-ethoxy-carbonyl)oxime.

Particularly preferred among these are the substituted acetophenones.

Preferred photoinitiators are photoactive compounds that undergo a Norrish I cleavage to generate free radicals that can initiate by addition to the acrylic double bonds. The photoinitiator can be added to the mixture to be coated after the polymer has been formed, i.e., photoinitiator can be added to the syrup composition. Such polymerizable photoinitiators are described, for example, in U.S. Pat. Nos. 5,902,836 and 5,506,279 (Gaddam et al.).

Such photoinitiators preferably are present in an amount of from 0.1 to 1.0 part by weight, relative to 100 parts by weight of the total syrup content. Accordingly, relatively thick coatings can be achieved when the extinction coefficient of the photoinitiator is low.

The syrup composition and the photoinitiator may be irradiated with activating UV radiation to polymerize the monomer component(s). UV light sources can be of two types: 1) relatively low light intensity sources such as blacklights, which provide generally 10 mW/cm$^2$ or less (as measured in accordance with procedures approved by the United States National Institute of Standards and Technology as, for example, with a UVIMAP UM 365 L-S radiometer manufactured by Electronic Instrumentation & Technology, Inc., in Sterling, Va.) over a wavelength range of 280 to 400 nanometers; and 2) relatively high light intensity sources such as medium pressure mercury lamps which provide intensities generally greater than 10 mW/cm$^2$, preferably 15 to 450 mW/cm$^2$. Where actinic radiation is used to fully or partially polymerize the syrup composition, high intensities and short exposure times are preferred. For example, an intensity of 600 mW/cm$^2$ and an exposure time of about 1 second may be used successfully. Intensities can range from 0.1 to 150 mW/cm$^2$, preferably from 0.5 to 100 mW/cm$^2$, and more preferably from 0.5 to 50 mW/cm$^2$.

In some embodiments, it is preferable to select a photoinitiator and photoacid generator combination wherein the PAG exhibits little to no UV absorption when a higher wavelength UV irradiation (e.g., UVA radiation, having a wavelength of 400 nm to 315 nm) is used to activate the photoinitiator and polymerize the monomer components, such that activation of the PAG and the cleavable crosslinkers is minimized or nonexistent during this polymerization step. Upon subsequent irradiation of the polymerized material with lower wavelength, high energy UV irradiation (e.g., UVC radiation, having a wavelength of 280 nm to 100 nm), the PAG may be activated, and cleavable crosslinkers in the polymerized network may be cleaved.

The degree of conversion can be monitored during the irradiation by measuring the index of refraction of the polymerizing medium as previously described. Useful coating viscosities are achieved with conversions (i.e., the percentage of available monomer polymerized) in the range of up to 30%, preferably 2% to 20%, more preferably from 5% to 15%, and most preferably from 7% to 12%. The molecular weight (weight average) of the solute polymer(s) is at least 100,000 g/mole, 500,000 g/mole, or greater.

When preparing (meth)acrylic polymers described herein, it is expedient for the photoinitiated polymerization reactions to proceed to virtual completion, i.e., depletion of the monomeric components, at temperatures less than 70° C. (preferably at 50° C. or less) with reaction times less than 24 hours, preferably less than 12 hours, and more preferably less than 6 hours. These temperature ranges and reaction rates obviate the need for free radical polymerization inhibitors, which are often added to acrylic systems to stabilize against undesired, premature polymerization and gelation. Furthermore, the addition of inhibitors adds extraneous material that will remain with the system and inhibit the desired polymerization of the syrup composition and formation of the crosslinked pressure-sensitive adhesives. Free radical polymerization inhibitors are often required at processing temperatures of 70° C. and higher for reaction periods of more than 6 to 10 hours.

The resulting copolymer, prior to irradiation (with a PAG) or heating (with a TAG) and cleaving of the crosslinks, may be represented by the formula:

$$-[M^{ester}]_a-[M^{acid}]_b-[M^{polar}]_c-[M^{vinyl}]_d-[M^{labile}]_e-[M^{xlink}]_g-, \qquad \text{III}$$

wherein
$[M^{ester}]$ represent (meth)acrylate ester monomer units and subscript a represents the weight percent thereof;
$[M^{acid}]$ represents acid-functional monomer units and subscript b represents the weight percent thereof;
$[M^{polar}]$ represents polar monomer units and subscript c represents the weight percent thereof;
$[M^{vinyl}]$ represents vinyl monomer units and subscript d represents the weight percent thereof;
$[M^{labile}]$ represent monomer units derived from the labile crosslinker of Formulas I or II and subscript e represents the weight percent thereof
$[M^{xlink}]$ represent monomer units derived from non-cleavable crosslinker and subscript g represents the weight percent thereof.

Prior to irradiation, the copolymer desirably has a storage modulus greater than $3 \times 10^5$ Pa at 25° C. and 1 Hz in the high crosslink density regions. In a patterned film article gel content of the acrylic copolymer differs by at least 5% between the regions of high crosslink density and regions of low crosslink density.

Post-irradiation, with cleavage of some portion of the crosslinks, the copolymer may be represented by the formula:

$$-[M^{ester}]_a-[M^{acid}]_b-[M^{polar}]_c-[M^{vinyl}]_d-[M^{labile}]_{e-f}-[M^{residue}]_f-[M^{xlink}]_g-, \qquad \text{IV}$$

wherein
$[M^{ester}]$ represent (meth)acrylate ester monomer units and subscript a represents the weight percent thereof;
$[M^{acid}]$ represents acid-functional monomer units and subscript b represents the weight percent thereof;
$[M^{polar}]$ represents polar monomer units and subscript c represents the weight percent thereof;
$[M^{vinyl}]$ represents vinyl monomer units and subscript d represents the weight percent thereof;
$[M^{labile}]$ represent monomer units derived from the labile crosslinker of Formulas I or II and subscript e-f represents the weight percent of the remaining amount of the labile crosslinking units remaining;
$[M^{residue}]$ represent the residue of monomer units derived from the labile crosslinker of Formulas I or II and f represents the weight percent thereof
$[M^{xlink}]$ represent monomer units derived from non-cleavable crosslinker and subscript g represents the weight percent thereof.

This disclosure further provides patterned adhesive articles comprising pattern elements of non-irradiated copolymer of Formula III having a crosslink density as result of the labile or cleavable crosslinking monomers, and pattern elements of post-irradiated copolymer of Formula IV have reduced crosslink density and comprising monomer units of cleaved crosslinker.

The pressure-sensitive adhesives may optionally contain one or more conventional additives. Preferred additives include tackifiers, plasticizers, dyes, antioxidants, UV stabilizers, and (e.g. inorganic) fillers such as (e.g. fumed) silica and glass bubbles. In some embodiments no tackifier is used. When tackifiers are used, the concentration can range from 5 or 10, 15 or 20 wt. % or greater of the (e.g. cured) adhesive composition.

Various types of tackifiers include phenol modified terpenes and rosin esters such as glycerol esters of rosin and pentaerythritol esters of rosin that are available under the trade designations "Nuroz", "Nutac" (Newport Industries), "Permalyn", "Staybelite", "Foral" (Eastman). Also available are hydrocarbon resin tackifiers that typically come from C5 and C9 monomers by products of naphtha cracking and are available under the trade names "Piccotac", "Eastotac", "Regalrez", "Regalite" (Eastman), "Arkon" (Arakawa), "Norsolene", "Wingtack" (Cray Valley), "Nevtack", LX (Neville Chemical Co.), "Hikotac", "Hikorez" (Kolon Chemical), "Novares" (Rutgers Nev.), "Quintone" (Zeon), "Escorez" (Exxonmobile Chemical), "Nures", and "H-Rez" (Newport Industries). Of these, glycerol esters of rosin and pentaerythritol esters of rosin, such as available under the trade designations "Nuroz", "Nutac", and "Foral" are considered biobased materials.

The (meth)acrylic polymer and PSA compositions can be coated on a substrate using conventional coating techniques modified as appropriate to the particular substrate. For example, these compositions can be applied to a variety of solid substrates by methods such as roller coating, flow coating, dip coating, spin coating, spray coating knife coating, and die coating. The composition may also be coated from the melt. These various methods of coating allow the compositions to be placed on the substrate at variable thicknesses thus allowing a wider range of use of the compositions. Coating thicknesses may vary from about 25 to 1500 microns (dry thickness). In typical embodiments, the coating thickness ranges from about 50 to 250 microns.

When the substrate is a release liner, the crosslinked polymer composition may be a free-standing polymeric film. The substrate can take any suitable form, such as, for example, a sheet, a fiber, or a shaped article.

The method of applying and activating the composition will vary depending on the desired use of the composition. In favored embodiments, activation of the composition occurs after applying the composition to a substrate. However, in alternative embodiments activation of the composition occurs prior to applying the composition to a substrate or concurrently with application to a substrate.

The PSAs may be coated upon a variety of flexible and inflexible backing materials using conventional coating techniques to produce adhesive-coated materials. Flexible substrates are defined herein as any material which is conventionally utilized as a tape backing or may be of any other flexible material. Examples include, but are not limited to plastic films such as polypropylene, polyethylene, polyvinyl chloride, polyester (polyethylene terephthalate), polycarbonate, polymethyl(meth)acrylate (PMMA), cellulose acetate, cellulose triacetate, and ethyl cellulose. Foam backings may be used. In some embodiments, the backing is comprised of a bio-based material such as polylactic acid (PLA).

The PSA can also be provided in the form of a pressure-sensitive adhesive transfer tape in which at least one layer of the adhesive is disposed on a release liner for application to a permanent substrate at a later time. The adhesive can also be provided as a single coated or double coated tape in which the adhesive is disposed on a permanent backing.

Backings may also be prepared of fabric such as woven fabric formed of threads of synthetic or natural materials such as cotton, nylon, rayon, glass, ceramic materials, and the like or nonwoven fabric such as air laid webs of natural or synthetic fibers or blends of these. The backing may also be formed of metal, metalized polymer films, or ceramic sheet materials may take the form of any article conventionally known to be utilized with pressure-sensitive adhesive compositions such as labels, tapes, signs, covers, marking indicia, and the like.

Backings can be made from plastics (e.g., polypropylene, including biaxially oriented polypropylene, vinyl, polyethylene, polyester such as polyethylene terephthalate), nonwovens (e.g., papers, cloths, nonwoven scrims), metal foils, foams (e.g., polyacrylic, polyethylene, polyurethane, neoprene), and the like. Foams are commercially available from various suppliers such as 3M Co., Voltek, Sekisui, and others. The foam may be formed as a coextruded sheet with the adhesive on one or both sides of the foam, or the adhesive may be laminated to it. When the adhesive is laminated to a foam, it may be desirable to treat the surface to improve the adhesion of the adhesive to the foam or to any of the other types of backings. Such treatments are typically selected based on the nature of the materials of the adhesive and of the foam or backing and include primers and surface modifications (e.g., corona treatment, surface abrasion).

In some embodiments, the backing material is a transparent film having a transmission of visible light of at least 90 percent. The transparent film may further comprise a graphic. In this embodiment, the adhesive may also be transparent.

In some embodiments a mixture of the copolymer and the photoacid generator is coated on a substrate and selectively irradiated using a mask to impart a preselected pattern of irradiation. In another embodiment the substrate is provided with a coating of the photoacid generator, and a separate layer of the copolymer, and selectively irradiated using a mask to impart a preselected pattern of irradiation. In another embodiment, the PAG layer is deposited on a substrate in a preselected pattern, followed by a layer of the copolymer.

A pattern may be imparted to the adhesive copolymer by means of a mask. During the pattern transfer process, patterns on the mask are projected onto the substrate that having a layer of the adhesive copolymer and PAG. This results in the mask pattern being transferred to the adhesive copolymer, in which the patterns have elements or features of high crosslink density in non-irradiated regions and lower crosslink density in irradiated regions.

The method of the invention uses an aperture mask to pattern the adhesive copolymer, the pattern is defined by one or more apertures in the aperture mask. The aperture mask can be formed from a polymer material such as, for example, polyimide or polyester. Polymer masks typically have a thickness of between about 0.05 mm and about 500 mm. In some instances, the use of polymeric materials for aperture masks can provide advantages over other materials, including ease of fabrication of the aperture mask, reduced cost of the aperture mask, and other advantages. Polymer aperture masks are flexible and are generally less prone to damage due to the accidental formation of creases or permanent bends. In addition, polymer aperture masks are generally less damaging to substrates. The use of flexible polymeric aperture masks is discussed in U.S. Pat. No. 6,821,348 (Baude et al.) and U.S. Pat. App. Pub. Nos. 03/0150384 (Baude et al.) and 03/0151118 (Baude et al.) and in US 2006/0128165 (Theiss et al.).

However, non-polymeric materials such as, for example, silicon, metals, or crystalline materials can be used for aperture masks, and are, in some instances preferable.

The arrangement and shape of mask apertures are subject to wide variation depending upon the shape and layout of selective irradiation desired by the user. One or more apertures can be formed to have widths and lengths (independently) of 0.1 to 10 millimeters, preferably 1 to 5 millimeters. The distance (gap) between two apertures can be less than approximately 0.1 to 10 millimeters.

The patterns may be imparted to the aperture mask by means known in the art. Gross features may be imparted simply by providing holes in the mask of the desired size, shape and spacing. Laser ablation techniques can be used to define finer patterns of apertures in aperture masks.

The aperture mask can be positioned in proximity to a substrate bearing a coating of the crosslinked copolymer that is to be patterned. When irradiated, the exposed portion of the composition (that is, the portion defined by the one or more apertures in the mask) will be yield regions of reduced crosslink density as result of cleavage of the crosslinks. The unexposed portion of the composition (that is, the portion covered by the aperture mask) will not be irradiated and the crosslink density will be substantially unchanged.

The pattern imparted to the adhesive layer does not necessarily refer to a regular repeating array, but may mean a random array of features having the same or different sizes and shapes. The pattern may repeat along one or both major axes of the coated substrate. Pattern elements, defined by the irradiated areas may be lines that are continuous from one edge to the opposite edge of the coated substrate. Such lines may be straight, wavy or zig-zag. Such lines may intersect to form screen-like or grid-like patterns. Pattern elements may be discreet, including of irradiated areas defining circles, semicircles, triangles, squares, rectangles, or other geometric shapes surrounded by non-irradiated areas of the adhesive coating. Conversely, the same pattern elements may be defined by non-irradiated area surrounded by irradiated areas, where the irradiated areas have lower crosslink density than the non-irradiated areas. To the extent the pattern elements regularly repeat, such repeating elements may be oriented at any angle with respect to a major axis or edge of the substrate.

In another embodiment, a PAG may be pattern coated on a suitable substrate, then provided with a layer of the adhesive copolymer. Upon irradiation, the PAG releases incipient acid, which diffuses into the matrix of the adhesive copolymer, cleaving the labile crosslinks. The PAG may be pattern coated by means known to the art, including printing and ink-jet techniques. In another, but less preferred embodiment, the substrate may be pattern coated with an organic or inorganic acid, optionally buffered, and then contacted with a layer of the crosslinked adhesive copolymer. Once contacted, the acid diffuses into the crosslinked polymer matrix and hydrolyzes the crosslinks. This results in a patterned adhesive article. In this embodiment, one cannot contact the adhesive copolymer and the patterned acid without initiating the cleavage.

Similarly, patterned articles may be prepared using the copolymer with labile crosslinks and a thermal acid generator. As with the PAG, the copolymer may be compounded with a TAG, and selectively heated to impart a pattern or regions of high crosslink density and low crosslink density. A patterned may be imparted, for example, with a heated, patterned die, roller or platen. In another embodiment the substrate may be provided with a coating of a thermal acid generator in a preselected pattern, the patterned photoacid generator provided with a layer of acrylic copolymer, and the coated article heated to thermolyze the TAG, releasing incipient acid, whereby the incipient acid catalyzes the cleavage of the crosslinks of the copolymer.

The total area defined by the pattern elements (as result of irradiation or heating) may be from 1-99% of the surface area of the adhesive coating. Generally the irradiated areas are at least 10 to 90% of the surface area of the adhesive coating.

Objects and advantages of this invention are further illustrated by the following examples. The particular materials and amounts, as well as other conditions and details, recited in these examples should not be used to unduly limit this invention.

EXAMPLES

Materials

| Abbreviation | Chemical Name | Source |
| --- | --- | --- |
| IOA | Isooctyl Acrylate | Sigma Aldrich, St. Louis, MO |
| 2-EHA | 2-Ethylhexyl Acrylate | Sigma Aldrich, St. Louis, MO |
| IBOA | Isobornyl Acrylate | Sigma Aldrich, St. Louis, MO |
| AA | Acrylic Acid | Alfa Aesar, Ward Hill, MA |
| HDDA | Hexanediol Diacrylate | Sigma Aldrich, St. Louis, MO |
| CDAC | Cleavable Diacrylate Crosslinker 2,2-di(2-acryloxyethoxy)propane | See preparation further below. |
| I651 | 2,2-dimethoxy-1,2-diphenylethan-1-one, "available under the trade designation IRGACURE 651" | BASF, Florey Park, NJ |
| D1173 | 2-Hydroxy-2-methyl-1-phenyl-propan-1-one "available under the trade designation DAROCURE 1173" | BASF, Florey Park, NJ |
| TPST | Triphenyl Sulfonium Triflate | Sigma Aldrich, St. Louis, MO |
| MEHQ | 4-methoxyphenol | Sigma Aldrich, St. Louis, MO |
| 2HEA | 2-Hydroxyethyl Acrylate | Sigma Aldrich, St. Louis, MO |
| DMP | 2,2-dimethoxypropane | Sigma Aldrich, St. Louis, MO |
| BDH4 | A buffer solution having a pH of 4- available under the trade designation BDH ® Reference Standard Buffers | VWR, Radnor, PA |
| RL 1 | Release Liner 1, a 0.003 inch (76 micrometers) thick siliconized polyester liner, available under the trade designation RF02N. | SKC Hass, Seoul, SK |
| RL 2 | Release Liner 2, a 0.003 inch (76 micrometers) thick siliconized polyester liner, available under the trade designation RF52N. | SKC Hass, Seoul, SK |

Peel Adhesion Strength (180 Degree Angle)

Coated samples having a thickness of approximately 0.002 inches (51 micrometers) prepared between two release liners were used to measure peel adhesion strength in the following manner. The first release liner was removed and the exposed coated surface laminated to 0.002 inch (51 micrometer) thick polyester film and rolled down by hand using a rubber roller. Some samples were irradiated with the release liner in place. Other samples were irradiated after removing the second release liner (full exposure). For fully exposed samples, a release liner was laminated as before to the exposed irradiated surface. For other samples the second liner was removed and a mask film applied before irradiation (patterned exposure). Control samples were also prepared applying the polyester film as described above, evaluated without any irradiation. Sample strips were then cut measuring 25.4 millimeter wide and 6 centimeters long, the release liner or mask film removed, and peel adhesion measured using a peel tester (Model SP-2100 Slip/Peel Tester, available from IMass Incorporated, Accord, Mass.). The exposed surface of the strip was applied to a stainless steel test panel previously wiped with isopropanol and rolled down using a 2 kilogram rubber roller. The stainless steel plate with sample was then affixed to the platform of the instrument. One end of the sample strip was doubled back at an angle of 180 degrees and attached to the horizontal peel arm of the tester. The peel test was initiated one minute after the adhesive was applied to the test panel and the sample peeled at a rate of 12 inches/minute (30.5 centimeters/minute) or 90 inches/minute (305 centimeters/minute). The average peel force was recorded in ounces/inch width and reported in Newtons/decimeter. For each sample, the value reported is an average of three sample strips. In addition, the peel profile of force over the distance of the peel was recorded to illustrate the resulting pattern in the activated adhesive films.

Shear Strength (at 70° C.)

Coated samples having a thickness of approximately 0.002 inches (51 micrometers) prepared between two release liners were used to measure shear strength at 70° C. in the following manner. The first release liner was removed and the exposed coated surface laminated to 0.002 inch (51 micrometer) thick polyester film and rolled down by hand using a rubber roller. The second release liner was then removed and fully exposed to irradiation. A release liner was then laminated as before to the exposed irradiated surface.

Cut sample strips measuring 25.4 millimeter wide and 6 centimeters long, the release liner removed and the strip applied by hand using a 2 kilogram rubber roller to a stainless steel panel, previously wiped clean with isopropanol, such that a 25.4 millimeter by 12.7 millimeter portion of each strip was in intimate contact with the panel. The remaining portion of each strip was folded around a metal hook and back on itself then twice stapled together. The panel with sample strip was placed vertically in a rack. A one kilogram weight was hung from the metal hook and the rack placed in a 70° C. oven. The time elapsed for the sample to separate from the test panel was recorded in minutes. Two specimens were tested for each sample and the average time to failure was reported. Samples exceeding 10,000 minutes discontinued and recorded as +10,000 minutes.

Tensile Strength and Elongation

Coated samples having a thickness of approximately 0.012 inches (300 micrometers) prepared between two release liners were used to measure tensile elongation in the following manner. Some samples were irradiated after removing the second release liner (full exposure). For fully exposed samples, a release liner was laminated as before to the exposed irradiated surface. For other samples the second liner was removed and a mask film applied before irradiation (patterned exposure). Sample strips were then cut measuring 5.0 centimeters long and 1 centimeter wide, the release liners removed from both side, or in other instances release liner and mask film removed. Both sides of each end of a test strip were covered with 3M Scotch® Heavy Duty Shipping Packaging Tape such that the middle 3 centimeters of the strip remained exposed. The taped strip was then placed in the tensile clamps of a TA XT Plus Texture Analyzer (Texture Technologies Corporation, Scarsdale, N.Y.) with the gap setting of 3 centimeters. The clamps were then separated at a rate of 5 millimeters/second and the stress and strain at break recorded. Two specimens were measured for each sample and average values reported.

Preparation of Cleavable Diacrylate Crosslinker (CDAC)

To a mixture of 785 grams (6.76 moles, 3 equivalents) of 2-hydroxyethyl acrylate and 0.429 grams (2.25 millimoles, 0.001 equivalents) of p-toluenesulfonic acid (monohydrate) was added 235 grams (2.25 moles, 1 equivalent) of 2,2-dimethoxypropane, 0.236 grams of MEHQ and 1.12 liters of cyclohexane. A steady stream of air was passed through the flask and the mixture was heated to 80° C. and held there for 10 hours. Methanol was collected by azeotropic distillation (approximately 160 milliliters was collected). Air was passed through the solution for several days to remove the solvent. The reaction mixture was then diluted with approximately 400 milliliters of ethyl acetate and extracted with 200 milliliters of saturated aqueous sodium bicarbonate solution followed by several water/brine washes. After approximately 7 liters of aqueous wash a sample was concentrated and H1 NMR analysis indicated less than 1% residual 2-hydroxyethylacrylate remaining. The remaining reaction product mixture was concentrated in vacuo and air was passed through this mixture for several hours until H1 NMR analysis showed less than 0.05% ethyl acetate remained. A total of 429 grams (64% yield) of the cleavable diacrylate crosslinker 2,2-di(2-acryloxyethoxy)propane product was obtained.

Preparation of Compositions 1-6 and Comparative Composition 1

Pre-Adhesive Syrup Preparation

Select acrylic monomers in Table 1 were each copolymerized and formulated into sample films using the following example formula from Example 1 in Table 2. 84.4 grams of IOA, 6.03 grams of AA and 0.04 grams of I-651, were mixed using a magnetic stir bar in a clear glass jar. The mixture was degassed by introducing nitrogen gas into it through a tube inserted through an opening in the jar's cap and bubbling vigorously for at least 5 minutes. After decreasing the nitrogen flow rate the contents of the jar were gently mixed and exposed to UV-A light until a pre-adhesive syrup having a viscosity deemed suitable for coating was formed. The nitrogen supply was then switched to air and this was introduced into the jar for at least five minutes. The UV-A light source was a blacklight fluorescent lamp having a peak emission of 360 nanometers. Additional photoinitiator and crosslinker were then added to each syrup sample as described below.

Coating and Curing of Pre-Adhesive Syrup

An additional 0.16 grams IRGACURE 651 photoinitiator were added to the pre-adhesive syrup of Example 1 and mixed until the photoinitiator was dissolved, followed by addition of 0.24 grams of HDDA, 9.0 grams of CDAC, and 0.04 g of TPST. The resulting pre-adhesive syrup was then coated using a notch bar coater and gap setting of 200 micrometers between RL1 and RL2 silicone treated PET release liners (SKC Hass, Seoul, SK) resulting in a coating thickness of approximately 50 micrometers. The coated composition was exposed on both sides to a total UV-A energy of 500 milliJoules/square centimeter using blacklight fluorescent lamps having a peak emission of 350 nanometers.

TABLE 1

| Composition No. | IOA % | 2EHA | AA | IBOA | Total I651 | Total D1173 | HDDA | CDAC | TPST |
|---|---|---|---|---|---|---|---|---|---|
| Comparative Composition 1 | 63.5 | | 4.5 | 22.7 | 0.20 | | 9.07 | 0 | 0.03 |
| 1 | 84.4 | | 6.03 | 0 | 0.24 | | 0.29 | 9.0 | 0.04 |
| 2 | 81.9 | | 5.85 | 0 | 0.23 | | 0.28 | 11.7 | 0.04 |
| 3 | 83.5 | | 6.2 | | | 0.20 | 0.06 | 10 | 0.04 |
| 4 | 85.7 | | 6.4 | | | 0.20 | 0.0 | 7.65 | 0.03 |
| 5 | | 60.6 | | 30 | 0.20 | | 0.20 | 9 | |
| 6 | | 45 | | 45 | | 0.2 | 0.2 | 9.57 | 0.03 |

Effect of Cleavable Diacrylate Crosslinker on Peel and Shear Properties

Examples 1-2 and Comparative Example 1

For the patterned exposure samples a mask film was prepared by cutting a series of parallel lines approximately 10 centimeters long out of a sheet of RL 1 using a cutter having two razor blades held in a parallel configuration to provide a mask film having a line width and spacing of 1.5 millimeters. This was placed onto the sample prior to UV irradiation. Samples were irradiated by passing under a Fusion Processer UV lamp system (Heraeus Noblelight, Gaithersburg, Md.) using a D-bulb arc lamp. After UV irradiation, the mask film was removed and the surface of the PSA evaluated for peel adhesion strength and shear strength as described in the test methods above using a peel rate of 12 inches per minutes.

The results in Table 2 below demonstrate that the use of a combination of a degradable (cleavable) crosslinking component (e.g. CDAC) and a non-degradable (non-cleavable) crosslinking component (e.g. HDDA) provides compositions which can be activated on demand to provide PSAs which exhibit a good balance of peel adhesion strength and elevated temperature shear strength properties. The extent of this effect is controlled by the amount of degradable (cleavable) crosslinking component employed in the composition, along with % area exposed (activated) by UV irradiation. In Examples 1 and 2 below, the patterned exposure was achieved using an aperture mask of 1.5 millimeter wide lines spaced 1.5 millimeters apart to give an irradiance area of approximately 50%. Shear strength values at 70° C. exceeded 10,000 minutes after UV irradiation for Comparative Example 1 and Examples 1 and 2, in spite of reduced levels of crosslinking in Examples 1 and 2.

TABLE 2

Effect of CDAC on Peel Adhesion and Shear Strength

| Example | Composition | 180 Degree Angle Peel (SS) (N/dm) Irradiance | | | 70 °C. Shear (SS) (minutes) Irradiance |
|---|---|---|---|---|---|
| | | 0 Joules/cm² Zero Exposure | 1.5 Joules/cm² Patterned Exposure | 1.5 Joules/cm² Full Exposure | 1.5 Joules/cm² Full Exposure |
| Comparative 1 | Comparative 1 | 6.2 | N.T. | 4.0 | +10,000 |
| 1 | 1 | 4.0 | 19.9 | 37.0 | +10,000 |
| 2 | 2 | 3.2 | 13.7 | 20.2 | +10,000 |

Effect of Pattern Geometry and Cleavable Diacrylate Crosslinker on Peel Properties Examples 3-6 and Comparative Examples 2-4

Mask films having a line pattern geometry were prepared as described for the Examples above by cutting a series of parallel lines approximately 10 centimeters long out of a sheet of RL 1 using a cutter having two razor blades held in a parallel configuration. Mask films having a dot pattern geometry in a hexagonal arrangement were prepared using an owl punch of the desired diameter. These mask films were placed onto samples of Composition 3 prior to UV irradiation. Comparative Examples employing either no mask film, or a mask film without patterns, were also evaluated. The % of area exposed was calculated using these dimensions. Samples were UV irradiated by passing them under a Fusion Processer UV lamp system (Heraeus Noblelight, Gaithersburg, Md.) using a D-bulb arc lamp. After UV irradiation, the mask film was removed and the surface of the PSA evaluated for peel adhesion strength and shear strength as described in the test methods above. Peel adhesion testing was run at 12 inches/minute (30.5 centimeters/minute) in the direction parallel with the lines (downweb).

The results in Table 3 below demonstrate the increase in peel adhesion strengths that can be obtained when compositions containing a combination of a degradable (cleavable) crosslinking component (e.g., CDAC) and a non-degradable (non-cleavable) crosslinking component (e.g., HDDA) are exposed to UV irradiation. Compositions of the invention can be activated on demand to provide PSAs which exhibit increased peel adhesion strengths. The use of various mask film patterns provides a means of controlling the amount of increase in a predictable manner. In addition, the peel adhesion strength of Example 3 measured in the crossweb direction was 26.3 Newtons/decimeter indicating this averaged property was similar in both the down and crossweb directions.

TABLE 3

Effect of Pattern Geometry on Peel Adhesion Strength with Composition 3

| Example | Irradiance (Joules/cm²) | Mask | Exposed Area (%) | 180 Degree Angle Peel (SS) In Downweb Direction (N/dm) |
|---|---|---|---|---|
| Comparative 2 | 0 | None Zero Exposure | 100 | 4.4 |
| Comparative 3 | 2 | None Full Exposure | 100 | 31.5 |
| Comparative 4 | 2 | RL 1 Zero Exposure (no pattern) | 0 | 4.2 |
| 3 | 2 | RL 1 1.2 mm lines/spacing | 45 | 22.0 |
| 4 | 2 | RL 1 3.5 mm lines/spacing | 45 | 23.5 |
| 5 | 2 | RL 1 3 mm diameter circles | 25 | 13.6 |
| 6 | 2 | RL 1 6 mm diameter circles | 25 | 14.6 |

Effect of Pattern Geometry and Cleavable Diacrylate Crosslinker on Peel Profile

Examples 8a and 8b

A mask film was prepared by cutting a series of parallel lines approximately 10 centimeters long out of a sheet of RL 1 using a cutter having two razor blades held in a parallel configuration to provide a mask film having a line width and spacing of 3.5 millimeters. This was placed onto film samples of Composition 4 prior to UV irradiation. Samples were UV irradiated using a Fusion Processer UV lamp system with a D-bulb arc lamp as described above to provide an irradiance of 2 Joules/square centimeter. After UV irradiation, the mask film was removed and the surface of the PSA evaluated for peel adhesion strength as described in the test method above. Peel adhesion testing was run at 12 inches/minute (30.5 centimeters/minute) in both the direction parallel with the lines (downweb) and perpendicular to them (crossweb). The peel strength adhesion profiles in FIGS. 1 and 2.

Figure 2:
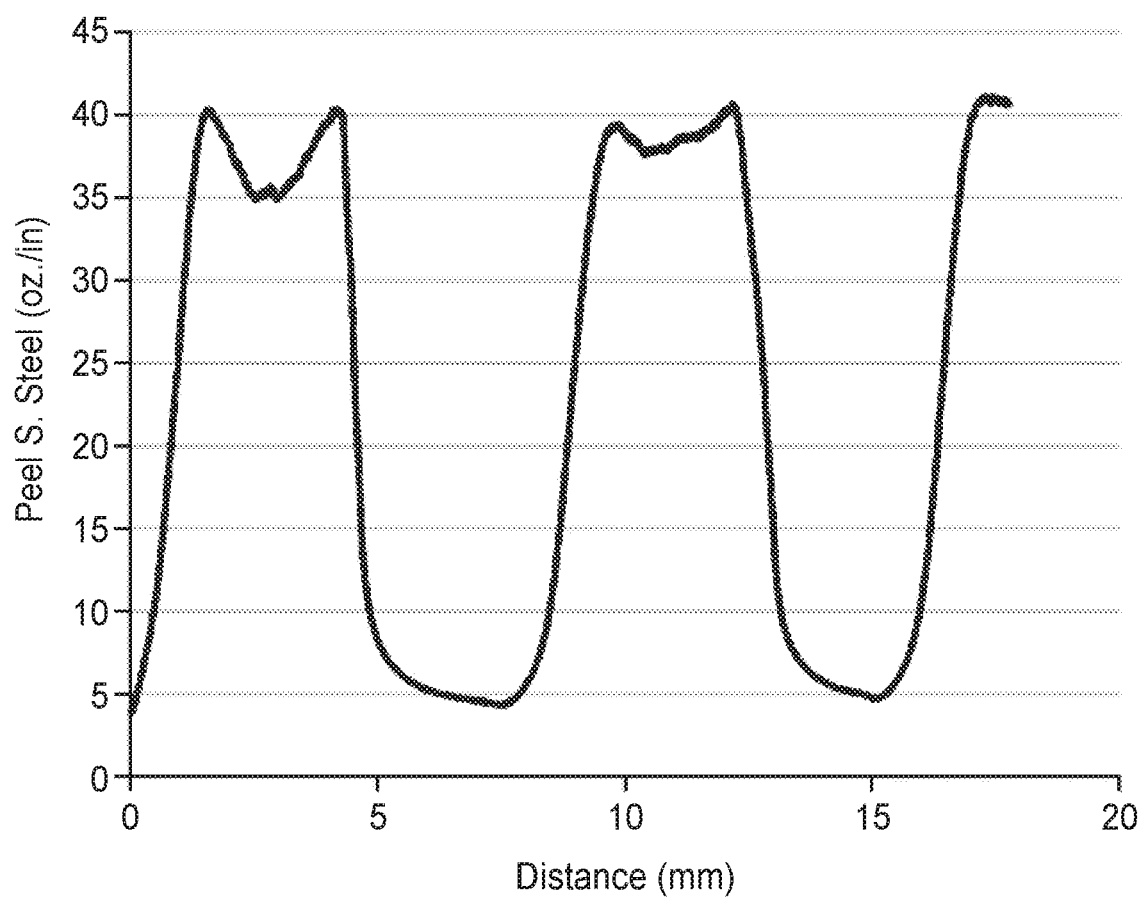

The results shown in FIGS. 1 and 2 for Examples 8a and 8b indicate that the peel adhesion strengths reflect a lined pattern. Moving downweb the area that was irradiated is constant and the peel forces remain constant. Moving crossweb the area that was irradiated varies between exposed and unexposed regions, and the peel forces vary in the same manner. Further, the regions of higher peel adhesion strength (ie., the exposed areas) are approximately the same in dimension as the regions of lower peel adhesion strength (i.e., the unexposed areas), consistent with the line widths and spacing being approximately the same.

Example 9

Figure 3:
FIG. 3 is a plot of the Peel Adhesion data of Example 9

Example 8 was repeated with the following modification. The line width was 7 millimeters, the line spacing was 3.5 millimeters, and the peel rate was 90 inches/minute (229 centimeters/minute). The lines were patterned in the crossweb direction. Peel adhesion was evaluated in the perpendicular (crossweb) direction. As seen in FIG. 3 and similar to Example 8b, moving crossweb the area that was irradiated varies between exposed and unexposed regions, and the peel forces vary in the same manner. Further, the regions of higher peel adhesion strength (i.e., the exposed areas) are approximately twice the dimension as the regions of lower peel adhesion strength (i.e., the unexposed areas), consistent with the line widths and spacing of approximately 7.0 millimeters and 3.5 millimeters respectively.

Example 10

Figure 4:
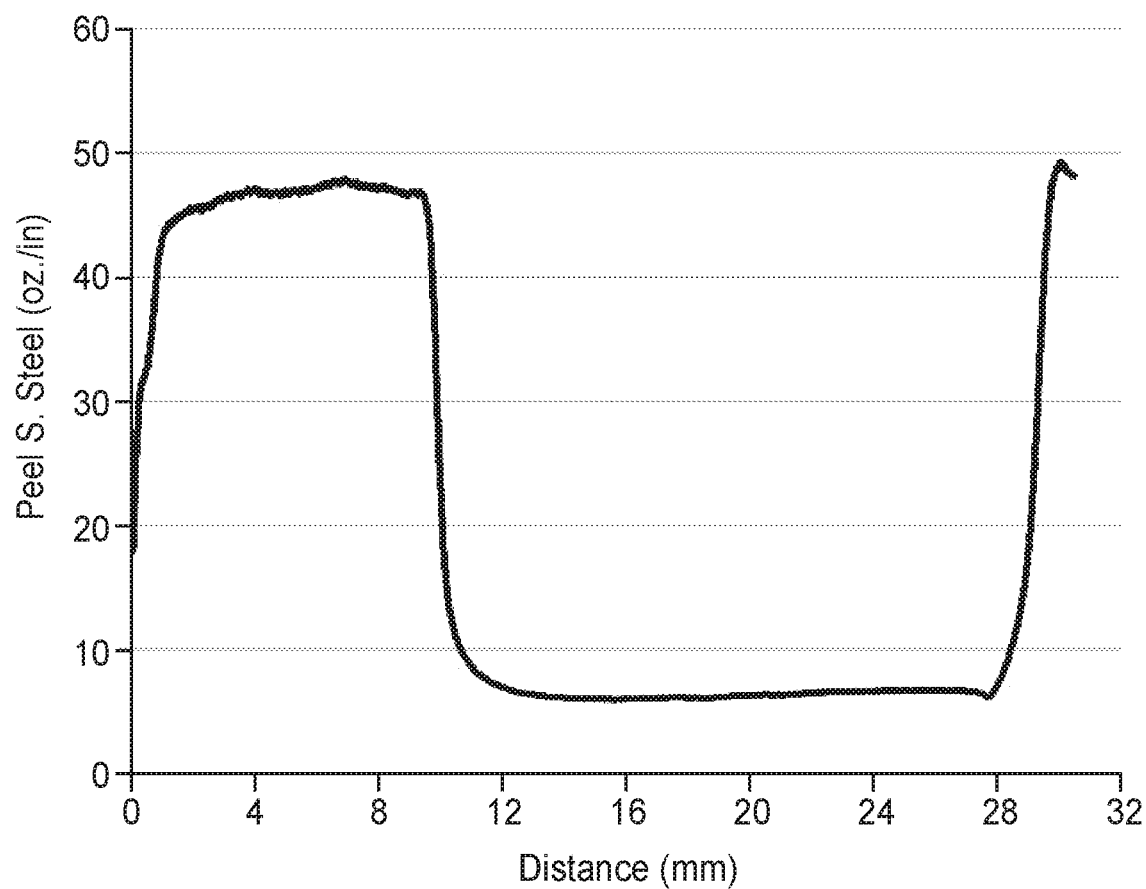
FIG. 4 is a plot of the Peel Adhesion data of Example 10

Example 8 was repeated with the following modification. The mask film was rectangular in shape with a width of 51 mm and a length of 33 mm, with a small border area measuring 11 mm at the top, 3 mm at the right and left sides, and 3 mm at the bottom. The border was exposed and a larger inner area (a rectangle of 45 mm wide and 19 mm in length was unexposed. Peel adhesion was evaluated across dimension of the rectangle. As seen in FIG. 4 the initial portion of the peel profile reflects peel from a region that was completely exposed and exhibits a higher peel adhesion strength. The data was normalized to the standard 1 inch (25.4 mm) width. As the test proceeded the peel profile reflects peel from a region that was primarily unexposed and exhibits a lower peel adhesion strength. The final part of the test again reflects peel from a region that was completely exposed and exhibits a higher peel adhesion strength. In addition, the dimensions from the peel profile are similar to the dimensions of the unexposed area indicating that the peel adhesion strength is directly proportional to exposed area and that the masked pattern is accurately transferred to the sample.

Example 11

Example 8 was repeated with the following modification. The mask film had a dot pattern geometry in a hexagonal arrangement, with the dots having a 6 millimeter diameter with a spacing of 12 mm center to center. Peel adhesion strength was evaluated in the parallel (downweb) direction. As with Example 8a, moving downweb the area that was irradiated is constant and the peel forces remain constant. Further, the regions of higher peel adhesion strength (i.e., the exposed areas) are approximately the same in dimension as the regions of lower peel adhesion strength (i.e. the unexposed areas), consistent with the constant dot diameter and the constant spacing between dots. The crossweb profile would be expected to be the approximately the same as the downweb profile due to uniform dot size and pattern being the same in both directions.

Figure 5:
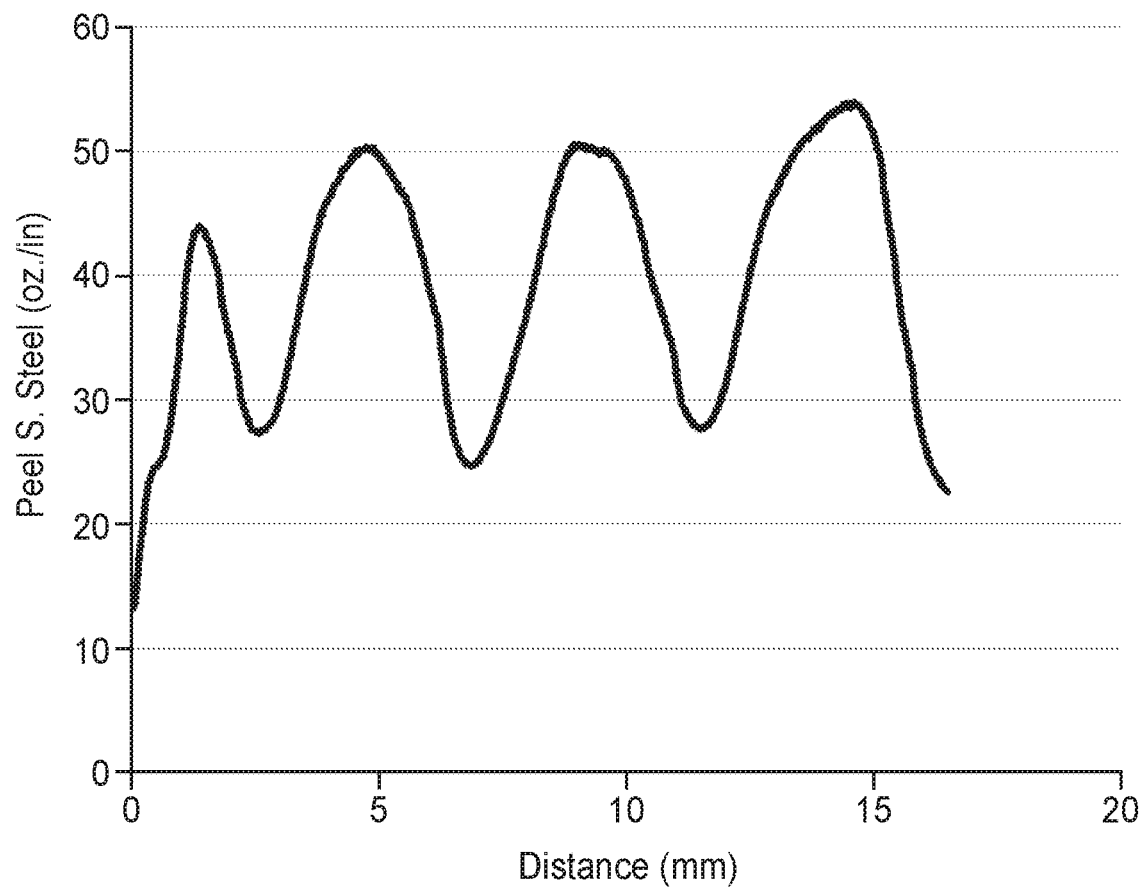
FIG. 5 is a plot of the Peel Adhesion data of Example 11

Moving crossweb the area that was irradiated varies between exposed and unexposed regions, and the peel forces vary in the same manner. Further, the regions of higher peel adhesion strength (i.e., the exposed areas) are approximately the same in dimension as the regions of lower peel adhesion strength (ie, the unexposed areas), consistent with the line widths and spacing being approximately the same. A plot of the Peel Adhesion is shown in FIG. 5.

Patterned Adhesive Activation with Catalyst Printed Liner

Another method to impart patterns of high and low tack within the activateable adhesive sheets of this invention is to print a pattern of an activating catalyst on a liner and then bring the printed liner in contact with the adhesive sheet. Coated samples having a thickness of approximately 0.002 inches (51 micrometers) were prepared between two release liners as described in Table 2. The first release liner was removed and the exposed coated surface laminated to 0.002 inch (51 micrometer) thick polyester film and rolled down by hand using a rubber roller. The second release liner was removed and laminated by hand using a rubber roller to RL1 release liner having patterned coated thereon a dried buffer composition (BDH).

Examples 12 and 13 in Table 4 below demonstrate this method using a printed pattern of dried acid buffer medium (BDH Buffer Solution pH4, VWR International) on RL1 release liner. Droplets of the buffer solution were deposited in a hexagonal array and then dried for 24 hours to yield an approximate dot density as described in Table 4 below. The liner from an activateable adhesive sheet of composition 5 was then removed, and the exposed film was laminated to the printed liner containing catalyst dots and allowed to age at 65 C for 3 weeks. After aging, the liners were removed and a strip of the adhesive sheet was tested in peel mode following the procedure outlined in Test Method 2 at a peel rate of 12 in/min. In Table 4, the peel performance is observed to be significantly enhanced both by the presence of the catalyst printer liner as well as the density of the activating catalyst dots on this liner suggesting that the adhesive is essentially activated by this method.

TABLE 4

Peel Performance of Adhesive Sheet Activated with Catalyst Printed Liner

| Example | Catalyst Dot Density (dots/in$^2$) | Aged at 65 C. (weeks) | 180 Degree peel on S. Steel (N/dm) |
| --- | --- | --- | --- |
| CE4 | 0 | 0 | 2.2 |
| CE5 | 0 | 3 | 15.9 |
| EX12 | 10 | 3 | 27.6 |
| EX13 | 100 | 3 | 35.1 |

Patterned Film Activation with UV Masks

To demonstrate the ability to use patterned UV exposure to target specific film behavior (in addition to patterned PSA behavior), a high modulus and highly crosslinked film of Composition 6 was generated following the procedure of Table 2. This film was then exposed to UV irradiation of 2 J/cm$^2$ under a Fusion Processer UV lamp system (Heraeus Noblelight, Gaithersburg, Md.) using a D-bulb arc lamp using a lined masks to pattern the exposure to the film. The parallel lined masks were again cut from RL1 liner using either 1 mm spaced or 3.5 mm spaced cutting blades. Comparative Examples 6 and 7 in Table 5 below demonstrate the elongation behavior of the initial film and fully exposed film (i.e. non mask or patterned exposure) of Preparatory Film 6. After full exposure, to degrade network crosslinks, Comparative Example 7 subsequently demonstrates greater % strain before break.

However, when a lined mask is used to pattern the exposure and area of network crosslink degradation, a significantly different strain behavior is observed. Particularly when the lined UV exposure is masked in a perpendicular direction to the direction of elongation in the tensile test, a degree of strain before break is even greater than the fully exposed sample. Furthermore, as the line thickness of exposure is decreased from 3.5 mm to 1 mm in width, the amount of strain observed before break is increased further. These results suggest that the method to pattern network structure using cleavable crosslinks and patterned stimuli to break these crosslinks may be used to successfully manipulate key characteristics of a film on demand.

TABLE 5

Tensile Performance of Film Sheet
Activated with UV Masked Exposure

| Example | UV Dose (J/cm²) | Mask/Pattern | Elongation Dir.: Mask Dir. | % Strain at Break | Stress at Break (MPa) |
|---|---|---|---|---|---|
| CE6 | 0 | None | NA | 81 | 7.58 |
| CE7 | 2 | None | NA | 176.5 | 3.22 |
| Ex14 | 2 | 3.5 mm lines | Parallel | 91.2 | 2.80 |
| Ex15 | 2 | 3.5 mm lines | Perpendicular | 233.0 | 1.03 |
| Ex16 | 2 | 1 mm lines | Parallel | 105.9 | 1.62 |
| Ex17 | 2 | 1 mm lines | Perpendicular | 284.1 | 0.99 |

The invention claimed is:

1. A method of making a patterned film article comprising the steps of:
    a) providing a substrate having a coating of a photoacid generator in a preselected pattern, contacting the patterned photoacid generator with a layer of acrylic copolymer, the acrylic copolymer having crosslinks with at least one group having the formula —O—C(R₂)(R₃)—O—, wherein R₂ and R₃ are independently hydrogen, alkyl, or aryl
    b) irradiating the coated substrate to photolyze the photoacid generator releasing incipient acid,
    whereby the incipient acid catalyzes the cleavage of the crosslinks of the copolymer; and
    wherein the copolymer comprises polymerized units derived from one or more non-cyclic alkyl (meth)acrylate monomer(s) having 4 to 20 carbon atoms.

2. The method of claim 1 where in the copolymer comprises interpolymerized monomer units of the formula:

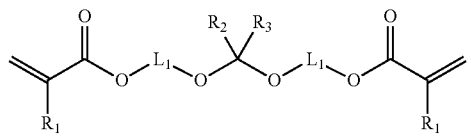

$R_1$ is hydrogen or methyl;
$R_2$ and $R_3$ are independently hydrogen, alkyl, or aryl; and
$L_1$ is a divalent linking group.

3. The method of claim 1 where in the copolymer comprises interpolymerized monomer units of the formula:

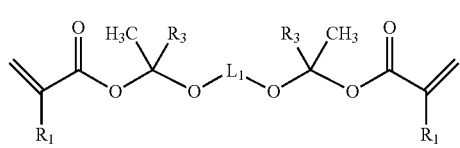

$R_1$ is hydrogen or methyl;
$R_3$ is independently hydrogen, alkyl, or aryl; and
$L_1$ is a divalent linking group.

4. A method making a patterned article comprising the steps of
    a) providing a substrate having a coating of an acid in a preselected pattern, contacting the patterned acid with a layer of acrylic adhesive copolymer, the acrylic adhesive copolymer having crosslinks with at least one group having the formula —O—C(R₂)(R₃)—O—, wherein R₂ and R₃ are independently hydrogen, alkyl, or aryl whereby the acid catalyzes the cleavage of the crosslinks of the adhesive copolymer.

5. The method of claim 4 wherein the patterned article has regions of high crosslink density and low crosslink density.

* * * * *